(12) United States Patent
Swager et al.

(10) Patent No.: US 10,672,988 B2
(45) Date of Patent: Jun. 2, 2020

(54) FUNCTIONALIZED NANOSTRUCTURES AND DEVICES INCLUDING PHOTOVOLTAIC DEVICES

(71) Applicants: Massachusetts Institute of Technology, Cambridge, MA (US); Eni S.p.A., Rome (IT)

(72) Inventors: Timothy M. Swager, Newton, MA (US); Vladimir Bulovic, Lexington, MA (US); Ggoch Ddeul Han, Cambridge, MA (US); Andrea Maurano, Cambridge, MA (US); Riccardo Po, Novara (IT); Andrea Pellegrino, Novara (IT)

(73) Assignees: Massachusetts Institute of Technology, Cambridge, MA (US); Eni S.p.A., Rome (IT)

( * ) Notice: Subject to any disclaimer, the term of this patent is extended or adjusted under 35 U.S.C. 154(b) by 347 days.

(21) Appl. No.: 15/305,076

(22) PCT Filed: Apr. 17, 2015

(86) PCT No.: PCT/US2015/026379
§ 371 (c)(1),
(2) Date: Oct. 18, 2016

(87) PCT Pub. No.: WO2015/161203
PCT Pub. Date: Oct. 22, 2015

(65) Prior Publication Data
US 2017/0186960 A1 Jun. 29, 2017

Related U.S. Application Data

(60) Provisional application No. 61/981,552, filed on Apr. 18, 2014.

(51) Int. Cl.
*H01L 31/00* (2006.01)
*H01L 51/00* (2006.01)
(Continued)

(52) U.S. Cl.
CPC .......... *H01L 51/0047* (2013.01); *H01B 1/04* (2013.01); *H01B 1/12* (2013.01); *H01L 51/0035* (2013.01);
(Continued)

(58) Field of Classification Search
CPC ............ H01L 51/0047; H01L 51/0045; H01L 51/0049; H01L 51/0032; H01L 51/0034
See application file for complete search history.

(56) References Cited

U.S. PATENT DOCUMENTS

2009/0202921 A1  8/2009  Suzuki et al.
2010/0179054 A1  7/2010  Swager et al.
(Continued)

FOREIGN PATENT DOCUMENTS

CN  101939352 A  1/2011
CN  102439059 A  5/2012
(Continued)

OTHER PUBLICATIONS

Paci et al., "Singlet Fission for Dye-Sensitized Solar Cells: Can a Suitable Sensitizer Be Found?," J. Am. Chem. Soc. 2006, 128, 16546-16553 (Year: 2006).*
(Continued)

*Primary Examiner* — Angelo Trivisonno
(74) *Attorney, Agent, or Firm* — Wolf, Greenfield & Sacks, P.C.

(57) ABSTRACT

Embodiments described herein provide functionalized carbon nanostructures for use in various devices, including photovoltaic devices (e.g., solar cells). In some cases, the carbon nanostructures are fullerenes substituted with one or (Continued)

more isobenzofulvene species and/or indane species. Devices including such materials may exhibit increased efficiency, increased open circuit potential, high electron/hole mobility, and/or low electrical resistance.

22 Claims, 7 Drawing Sheets

(51) Int. Cl.
```
H01B 1/12      (2006.01)
H01B 1/04      (2006.01)
H01L 51/42     (2006.01)
C01B 32/152    (2017.01)
H01L 51/44     (2006.01)
```
(52) U.S. Cl.
CPC ...... *H01L 51/0036* (2013.01); *H01L 51/0037* (2013.01); *H01L 51/0049* (2013.01); *C01B 32/152* (2017.08); *H01L 51/0043* (2013.01); *H01L 51/4253* (2013.01); *H01L 51/441* (2013.01); *Y02E 10/549* (2013.01)

(56) References Cited

U.S. PATENT DOCUMENTS

2013/0089790 A1  4/2013  Byon et al.
2013/0270545 A1* 10/2013  Tanaka ................ B82Y 10/00
                                                257/40

FOREIGN PATENT DOCUMENTS

CN   103227289 A   7/2013
EP   2472656 A2    7/2012

OTHER PUBLICATIONS

Extended European Search Report dated Dec. 5, 2017 for Application No. EP 15780617.5.
He et al., Indene-$C_{60}$ bisadduct: A new acceptor for high-performance polymer solar cells. J Am Chem Soc. Jan. 7, 2010;132(4):1377-82.
International Search Report and Written Opinion for PCT/US2015/026379 dated Jul. 8, 2015.
International Preliminary Report on Patentability for PCT/US2015/026379 dated Oct. 27, 2016.
Abate et al., Lithium salts as "redox active" p-type dopants for organic semiconductors and their impact in solid-state dye-sensitized solar cells. Phys Chem Chem Phys. Feb. 21, 2013;15(7):2572-9. doi:10.1039/c2cp44397j. Epub Jan. 11, 2013.
Arias et al., Kinetic effects in the electrochemistry of fullerene derivatives at very negative potentials. J Am Chem Soc. Jul. 13, 1994;116(14):6388-94.
Bertho et al., Effect of temperature on the morphological and photovoltaic stability of bulk heterojunction polymer:fullerene solar cells. Sol Energ Mat Sol. Jul. 2008;92(7):753-60.
Bi et al., Using a two-step deposition technique to prepare perovskite (CH3NH3PbI3) for thin film solar cells based on ZrO2 and TiO2 mesostructures. RSC Adv. 2013;3:18762-6. doi:10.1039/C3RA43228A.
Boix et al., Current progress and future perspectives for organic/inorganic perovskite solar cells. Mater Today. 2014;17(1):16-23.
Burschka et al., Sequential deposition as a route to high-performance perovskite-sensitized solar cells. Nature. Jul. 18, 2013;499(7458):316-9. doi: 10.1038/nature12340. Epub Jul. 10, 2013.
Chambon et al., Photo- and thermal degradation of MDMO-PPV:PCBM blends. Solar Energy Materials and Solar Cells. Mar. 6, 2007;91(5):394-8.

Chang et al., Transition Metal-Oxide Free Perovskite Solar Cells Enabled by a New Organic Charge Transport Layer. ACS Appl Mater Interfaces. Apr. 6, 2016;8(13):8511-9. doi:10.1021/acsami.6b00635. Epub Mar. 22, 2016.
Cheng et al., Di(4-methylphenyl)methano-C60 Bis-Adduct for Efficient and Stable Organic Photovoltaics with Enhanced Open-Circuit Voltage. Chem Mater. 2011;23(17):4056-62.
Dattani et al., A general mechanism for controlling thin film structures in all-conjugated block copolymer:fullerene blends. J Mater Chem A; 2014;2:14711-9.
Hoke et al., The Role of Electron Affinity in Determining Whether Fullerenes Catalyze or Inhibit Photooxidation of Polymers for Solar Cells. Advanced Energy Materials. Nov. 2012;2(11):1351-7.
Jeng et al., CH3NH3PbI3 perovskite/fullerene planar-heterojunction hybrid solar cells. Adv Mater. Jul. 19, 2013;25(27):3727-32. doi: 10.1002/adma.201301327. Epub Jun. 18, 2013.
Jeon et al., o-Methoxy substituents in spiro-OMeTAD for efficient inorganic-organic hybrid perovskite solar cells. J Am Chem Soc. Jun. 4, 2014;136(22):7837-40. doi: 10.1021/ja502824c. Epub May 23, 2014.
Kadish et al., Effect of Addition Pattern on the Electrochemical and Spectroscopic Properties of Neutral and Reduced 1,2- and 1,4-(C6H5CH2)2C60 Isomers. J Phys Chem. 2000;104:3878-83.
Lee et al., Efficient hybrid solar cells based on meso-superstructured organometal halide perovskites. Science. Nov. 2, 2012;338(6107):643-7. doi: 10.1126/science.1228604. Epub Oct. 4, 2012.
Li et al., Performance enhancement of fullerene-based solar cells by light processing. Nat Commun. 2013;4:2227. doi: 10.1038/ncomms3227.
Lindqvist et al., Fullerene Nucleating Agents: A Route Towards Thermally Stable Photovoltaic Blends. Adv Energy Mat. Jun. 24, 2014;4(9):1301437.
Liu et al., Fullerene bisadduct as an effective phase-separation inhibitor in preparing poly(3-hexylthiophene)-[6,6]-phenyl-C61-butyric acid methyl ester blends with highly stable morphology. J Mater Chem. 2012;22:15586-91.
Liu et al., Understanding the Morphology of PTB7:PCBM Blends in Organic Photovoltaics. Advanced Energy Materials. Apr. 2, 2014;4(5):1301377.
Lombardo et al., The reaction of benzonorbornadiene and related compounds with iron carbonyls. Australian Journal of Chemistry. 1974;27:143-52.
Malinkiewicz et al., Perovskite solar cells employing organic charge-transport layers. Nature Photonics; 2014;8:128-32. doi:10.1038/nphoton.2013.341.
Noh et al., Nanostructured TiO2/CH3NH3PbI3 heterojunction solar cells employing spiro-OMeTAD/Co-complex as hole-transporting material. J Mat Chem. 2013;1:11842-7. doi:10.1039/C3TA12681A.
Penn et al., Analysis of C60 oxides and C120On (n=1,2,3) using matrix assisted laser desorption-ionization Fourier transform mass spectrometry. Int J of Mass Spec and Ion Processes. Dec. 1997;(169-70):371-86.
Po et al., From lab to fab: how must the polymer solar cell materials design change?—An industrial perspective. Energy Environ Sci. 2014;7:925-43.
Puplovskis et al., New Route for [60]Fullerene Functionalisation in [4+2] Cycloaddition Reaction Using Indene. Tetrahedron Letters. 1997;38(13):285-8.
Qin et al., Inorganic hole conductor-based lead halide perovskite solar cells with 12.4% conversion efficiency. Nat Commun. May 12, 2014;5:3834. doi:10.1038/ncomms4834.
Reese et al., Photoinduced Degradation of Polymer and Polymer-Fullerene Active Layers: Experiment and Theory. Advanced Functional Materials. Oct. 22, 2010;20(2):3476-83.
Ren et al., Heterojunction photovoltaics using GaAs nanowires and conjugated polymers. Nano Lett. Feb. 9, 2011;11(2):408-13. doi: 10.1021/nl1030166. Epub Dec. 20, 2010.
Richards et al., Modification of PCBM Crystallization via Incorporation of C60 in Polymer/Fullerene Solar Cells. Advanced Functional Materials. Jan. 28, 2013;23(4):514-22.
Seo et al., Benefits of very thin PCBM and LiF layers for solution-processed p-i-n perovskite solar cells. Energy Environ Sci. 2014;7:2642-6.

(56) References Cited

OTHER PUBLICATIONS

Stranks et al., Electron-hole diffusion lengths exceeding 1 micrometer in an organometal trihalide perovskite absorber. Science. Oct. 18, 2013;342(6156):341-4. doi:10.1126/science.1243982.
Tanida et al., Generation and Cycloaddition of 8,8-Dimethylisobenzofulvene. Bull Chem Soc Jpn. 1972;45:1999-2003.
Wang et al., Large fill-factor bilayer iodine perovskite solar cells fabricated by a low-temperature solution-process. Energy Environ Sci. 2014;7:2359-65. doi:10.1039/C4EE00233D.
Warrener et al., The trapping of 6,6-Dimethylisobenzofulvene by its 1,3-dipolar precursor: A rare example of a dipolar [6+4] cycloaddition. Synthetic Communications. 2001;31:1167-75.
Wong et al., Morphological stability and performance of polymer-fullerene solar cells under thermal stress: the impact of photoinduced PC60BM oligomerization. ACS Nano. Feb. 25, 2014;8(2):1297-308. doi: 10.1021/nn404687s. Epub Jan. 16, 2014.
You et al., Moisture assisted perovskite film growth for high performance solar cells. Appl Phys Lett. 2014;105:183902.
Zhou et al., Photovoltaics. Interface engineering of highly efficient perovskite solar cells. Science. Aug. 1, 2014;345(6196):542-6. doi: 10.1126/science.1254050.

\* cited by examiner

FUNCTIONALIZED NANOSTRUCTURES AND DEVICES INCLUDING PHOTOVOLTAIC DEVICES

CROSS-REFERENCE TO RELATED APPLICATIONS

This application is a national phase of International Application No. PCT/US2015/026379, titled "FUNCTIONALIZED NANOSTRUCTURES AND DEVICES INCLUDING PHOTOVOLTAIC DEVICES", filed Apr. 17, 2015, which claims the benefit of U.S. Patent Application No. 61/981,552, "FUNCTIONALIZED NANOSTRUCTURES AND DEVICES INCLUDING PHOTOVOLTAIC DEVICES", filed Apr. 18, 2014, both of which applications are hereby incorporated by reference in their entirety.

FIELD OF THE INVENTION

Compositions and devices including nanostructures comprising isobenzofulvene species and/or indane species are provided, as well as related methods.

BACKGROUND OF THE INVENTION

Polymer solar cells with bulk heterojunction (BHJ) active layers have attracted significant research efforts due to their large surface to volume ratio, tunability, processability, and potential low-cost. The structure and property of the components in the BHJ are investigated and optimized in order to produce appreciable power conversion efficiency (PCE). While research on p-type conjugated polymers has focused largely on reducing band gaps for the absorption of a larger fraction of the solar spectrum, many n-type acceptors, including small molecules and fullerenes, have been developed to be electronically and morphologically compatible with their p-type counterparts. Covalently functionalized fullerenes such as PCBM ([6,6]-phenyl-$C_{61}$-butyric acid methyl ester) and ICBA (Indene-$C_{60}$ Bisadducts) are widely used n-type molecules and have been shown to generate promising PCEs in combination with suitable polymer counterparts. In particular, notably high open-circuit voltages ($V_{OC}$) of P3HT:ICBA BHJ solar cell have been observed and attributed to the high-lying LUMO level of ICBA, since a $V_{OC}$ of an organic solar cell is considered to have linear correlation with an effective band gap, $HOMO_D$-$LUMO_A$ (A: acceptor, D: donor). Hence, novel acceptors with high LUMO levels have been designed and investigated for high $V_{OC}$ devices.

Most of the covalent functionalization methods applied on fullerenes generally decrease their electron affinity and raise the LUMO levels by breaking the full conjugation of the fullerene surface. However, the extent of the change can depend on the structural and electronic property of the addend, as seen when comparing different fullerene derivatives. In previous studies of tetraalkylcyclobutadiene-$C_{60}$ adducts, the cofacial interaction between $C_{60}$ and π-orbital of the addend was shown to induce a significant change of the LUMO energy levels of fullerenes. Indene-$C_{60}$ adducts also exhibited considerable cofacial interactions due to the aromatic moiety near the $C_{60}$ surface.

SUMMARY OF THE INVENTION

Devices, including photovoltaic devices, are provided. In some embodiments, the device comprises a composition comprising a carbon nanostructure comprising a substituted isobenzofulvene group or a substituted indane group; and at least one electrode in electrochemical communication with the composition.

In some embodiments, the device is a photovoltaic device comprising an electron donor material; and an electron acceptor material in contact with the electron donor material and comprising a substituted isobenzofulvene group or a substituted indane group.

Methods for fabricating a device are also provided, comprising reacting a carbon nanostructure with an isobenzofulvene group precursor to produce a functionalized carbon nanostructure comprising a substituted isobenzofulvene group; and arranging the functionalized carbon nanostructure in electrochemical communication with an electrode.

Compositions comprising carbon nanostructures are also provided. In some embodiments, the carbon nanostructure comprises a fused network of aromatic rings, optionally comprising a border at which the fused network terminates, wherein the carbon nanostructure comprises the following structure,

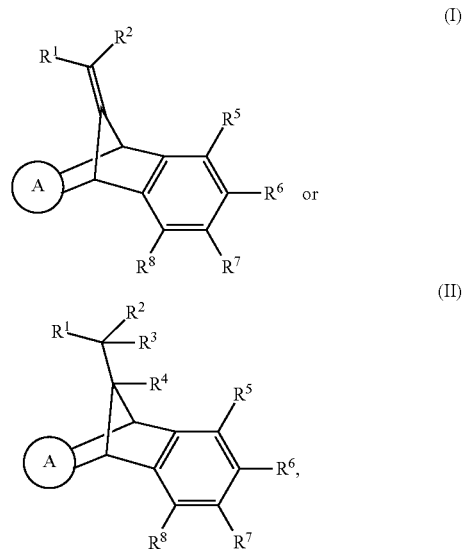

wherein:

A comprises the fused network of aromatic rings of the carbon nanostructure; and $R^1$-$R^8$ can be the same or different and are hydrogen, hydroxyl, halo, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

Embodiments described herein provide functionalized carbon nanostructures for use in various devices, including photovoltaic devices (e.g., solar cells). Devices including such materials may exhibit increased efficiency, increased open circuit potential, high electron/hole mobility, and/or low electrical resistance.

In some cases, carbon nanostructures having one or more functional groups capable of enhancing the electronic properties of the carbon nanostructures are provided. The composition may include functional groups which are selected and positioned to interact with a portion of the carbon nanostructure and/or another component in contact with the carbon nanostructure, such as a polymer, thereby enhancing one or more properties of the carbon nanostructure. For example, the carbon nanostructure may include a functional group positioned in close physical proximity to the pi-system of the carbon nanostructure, resulting in favorable cofacial pi-orbital interactions which affect the electronic properties of the carbon nanostructure. In some cases, the functional group may affect (e.g., increase, decrease) the electron affinity of the carbon nano structure. In some cases, the functional group may affect (e.g., increase, decrease) the energy level of the lowest unoccupied molecular orbital (LUMO) of the carbon nanostructure. As an illustrative embodiment, the carbon nanostructure may be a fullerene (e.g., C$_{60}$) which includes an olefin functional group attached to and positioned in close proximity to the surface of the fullerene, allowing for cofacial pi-orbital interactions between the olefin and the fullerene. Such interactions may effectively increase the LUMO level of the fullerene and increase open-circuit voltage of device. In some embodiments, the electron affinity and/or LUMO energy level of the carbon nanostructure may be tuned by further functionalization (e.g., epoxidation) of the olefin functional group, as described more fully below.

Figure 1:
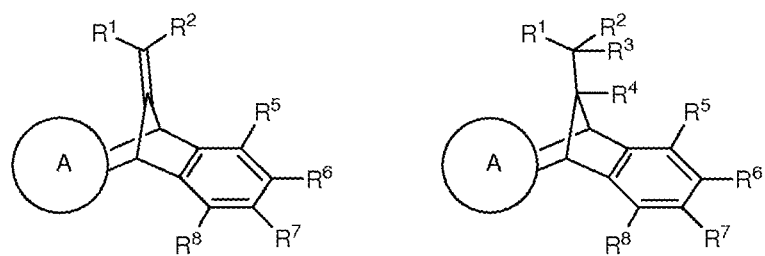
FIG. 1 shows the structure of a carbon nanostructure appended with an isobenzofulvene species and/or indane species.

In some embodiments, compositions comprising carbon nanostructures substituted with a substituted isobenzofulvene groups and/or a substituted indane group are provided. (FIG. 1) In some cases, the carbon nanostructure includes one or more substituted isobenzofulvene groups. The isobenzofulvene group may include a carbon-carbon double bond and/or a phenyl group positioned relative to the surface of the carbon nanostructure such that pi-pi interactions may occur between the carbon nanostructure and the carbon-carbon double bond and/or the phenyl group. In some cases, the carbon nanostructure includes one or more substituted indane groups. In some cases, the carbon nanostructure includes a combination of substituted isobenzofulvene and substituted indane groups. For example, the carbon nanostructure may include a fused network of aromatic rings, optionally comprising a border at which the fused network terminates, such that the substituted isobenzofulvene group and/or a substituted indane group is attached to the network via at least one ring atom of the network. In some cases, the substituted isobenzofulvene group and/or a substituted indane group is attached to the network via two ring atoms of the network (e.g., two adjacent ring atoms of the network). In some embodiments, the substituted isobenzofulvene group and/or a substituted indane group may be directly bonded to the carbon nanostructure, i.e., a ring atom of the substituted isobenzofulvene group and/or a substituted indane group may form a covalent bond with a ring atom of the network of aromatic rings. In some cases, two ring atoms of the at least one substituted isobenzofulvene group and/or at least one substituted indane group form covalent bonds with two ring atoms of the network of aromatic rings. By contrast, a substituted isobenzofulvene group and/or a substituted indane group is not directly bonded to the carbon nanostructure if there is another atom or group (e.g., a methylene group, an aryl group, a metal atom, etc.) present that links the substituted isobenzofulvene group and/or a substituted indane group to the carbon nanostructure.

The substituted isobenzofulvene group and/or a substituted indane group may be selected such that a portion of substituted isobenzofulvene group and/or a substituted indane group is arranged in a substantially fixed position relative to the carbon nanostructure. That is, a portion of the substituted isobenzofulvene group and/or a substituted indane group may not freely rotate such that the portion can be positioned at a range of different distances from the carbon nanostructure. In some cases, a portion of the substituted isobenzofulvene group and/or a substituted indane group may be positioned in a substantially fixed position about 3 Angstroms (e.g., 3.1 Angstroms) from the carbon nanostructure. For example, a fullerene may be fused to a substituted isobenzofulvene group via two bonds, such that a portion of the substituted isobenzofulvene group (e.g., a phenyl ring) is arranged in a substantially fixed position above the fullerene. In some cases, the portion includes a carbon-carbon double bond, which is positioned in sufficient proximity to the carbon nanostructure to interact with the carbon nanostructure via cofacial pi-interactions. In some cases, the ring atoms of the substituted isobenzofulvene group and/or a substituted indane group may be positioned in a substantially fixed position relative to the carbon nanostructure, but one or more substituents of the substituted isobenzofulvene group and/or a substituted indane group may freely rotate.

In some cases, functionalizing a carbon nanostructure with a substituted isobenzofulvene group and/or a substituted indane group as described herein may decrease the electron affinity of, and therefore increase the LUMO energy level of, the carbon nanostructure. In some cases, a carbon nanostructure substituted with a substituted isobenzofulvene group and/or a substituted indane group may exhibit an increase in LUMO energy level of about 20 meV, 50 meV, about 100 meV (e.g., 90 meV), about 150 meV, about 200 meV, about 250 meV (e.g., 260 meV), about 300 meV, about 350 meV, about 400 meV, or about 450 meV, relative to the LUMO energy level of ([6,6]-phenyl-$C_{61}$-butyric acid methyl ester) (PCBM).

In some embodiments, the composition comprising the functionalized carbon nanostructures may be provided as a solution. In some embodiments, the composition may be provided as a solid or a substantially solid substance (e.g., gel). For example, the composition may be formed as a solid-state film. The film may be formed using methods known in the art, including solution coating, ink jet printing, spin coating, dip coating, spray coating, and the like. In some embodiments, at least a portion of the film may have a thickness between about 1 nm and about 1 mm, or between about 1 nm and about 500 um, or between about 1 nm and about 500 nm, or between about 100 nm and about 500 nm, or between about 100 nm and about 300 nm. In one set of embodiments, at least a portion of the film has a thickness of 75 nm. Film thickness may be determined by methods known in the art, including ellipsometry. In some cases, the film thickness may be measured using ellipsometry on films, such as films prepared on silicon substrates.

Compositions comprising a functionalized carbon nanostructure as described herein may be incorporated into a wide range of applications, including photovoltaic devices (e.g., solar cells), batteries, capacitors, transistors, catalyst systems, or chemical or biological sensors. The composition may be arranged in connection with an external source of energy, one or more electrodes, an electrolyte, separator materials, sample inlets and outlets, sample cells, substrates, detectors, power sources, and/or other device components suitable for a particular application. For example, the composition may be arranged to be in electrochemical communication with an electrode material, such that a potential or voltage may be applied to the composition. In some cases, the composition may be used as a photoactive material in a device. In some cases, the composition may be arranged to be exposed to a sample suspected of containing an analyte, such as a chemical or biological analyte. In some cases, the composition may be included in an electrode material for electrocatalysis.

In some cases, the device is a photovoltaic cell, such as a solar cell. Photovoltaic cells generally include a photoactive material containing an electron acceptor/electron donor material, and at least two electrodes (e.g., an anode and a cathode). The device may also include a substrate (e.g., on which to form the photoactive material, anode, and/or cathode), electron-blocking and/or electron-transporting membrane(s), circuitry, a power source, and/or an electromagnetic radiation source. In some cases, the composition including the functionalized carbon nanostructures may be used as an electron acceptor material or an n-type material in a photovoltaic device. For example, a photovoltaic device may include a photoactive material comprising an electron acceptor material that includes functionalized carbon nanostructures as described herein in contact with an electron donor material, where the photoactive material is placed in contact with two electrodes. The electron donor and electron acceptor materials may be arranged to form a bulk heterojunction and to have sufficient donor—acceptor interfacial area to favor exciton dissociation and efficient transport of separated charges to the respective electrodes.

Those of ordinary skill in the art will be able to select suitable electron donor materials for use in the embodiments described herein. In some cases, the electron donor material may be a polymer. For example, the polymer may be a conducting polymer. In some embodiments, the conducting polymer is a semiconducting polymer. Examples of conducting polymers include polyaniline, polythiophene, polypyrrole, polyphenylene, polyarylene, poly(bisthiophene phenylene), a ladder polymer, poly(arylene vinylene), poly (arylene ethynylene), metal derivatives thereof, or substituted derivatives thereof. In some cases, the polymer may be a low band gap polymer, such as a polymer including one or more heteroaryl groups. In some embodiments, the polymer contains a nitrogen-containing heteroaryl. Examples of heteroaryl groups include triazoles, carbazoles, pyrroles, thiadiazoles, benzotriazoles, benzothiadiazoles, benzodithiophenes, or imidazoles.

Some specific examples of polymers suitable for use as electron donor materials include poly(3-hexylthiophene) (P3HT), poly(benzo[1,2-b:4,5-b']dithiophene-thieno[3,4-c] pyrrole-4,6-dione) (PBDTTPD), poly({4,8-bis[(2-ethylhexyl)oxy]benzo[1,2-b:4,5-b']dithiophene-2,6-diyl} {3-fluoro-2-[(2-ethylhexyl)carbonyl]thieno[3,4-b]thio-phenediyl}) (PTB7), poly[2,6-(4,4-bis-(2-ethylhexyl)-4H-cyclopenta [2,1-B;3,4-B'] dithiophene)-alt-4,7(2,1,3-benzothiadiazole)] (PCPDTBT), and poly{[4'-(4,8-di(2-ethylhexyloxy)benzo[1,2-b:4,5-b']dithiophen-2-yl]-2',1',3'-benzothiadiazole-6,7'-diyl]-co-[4'-(4,8-di(2-ethylhexyloxy) benzo[1,2-b:4,5-b']dithiophen-2-yl)-(1-octylnonyl)-benzotriazole-6,7'-diyl]}.

Some embodiments may involve advantageous interactions between the electron donor material and the electron acceptor material to improve device performance. In some cases, the electron donor material may include an electron-donating species and the electron acceptor material may include an electron-withdrawing species, where the electron-donating species and electron-withdrawing species interact. For example, the electron donor material may include a fullerene species comprising an epoxide group and the electron acceptor material may include a low band gap polymer comprising heterocyclyl group, such as a triazole, wherein the epoxide ground and the triazole group interact with one another via, for example, hydrogen bonding, electrostatic interactions, or other interactions. In other embodiments, the electron donor material may include an electron-withdrawing species and the electron acceptor material may include an electron-donating species, where the electron-withdrawing species and electron-donating species interact.

In some cases, it may be advantageous to include a functional group which creates a dipole associated the functionalized carbon nanostructure, and/or facilitates a dipolar organization at the interface between the electron donor material and the electron acceptor material. For example, introduction of a polar group (e.g., an oxygen-containing group such as an epoxide) within the functionalized carbon nano structure (e.g., fullerene) may enhance transport of charge away from such an interface, resulting in a slower rate of recombination. Such properties may be advantageous in optimizing VOC, charge transfer ($J_{SC}$), and/or PCE for photovoltaic devices.

The photovoltaic device may further comprise electrodes and/or other components arranged in contact with or in association with the electron donor and electron acceptor materials. The photovoltaic device may be exposed to light using methods known to those of ordinary skill in the art. The light may interact with the photoactive material, causing electrons to be transferred from the electron donor material (e.g., polymer) to the n-type material or electron-acceptor material (e.g., functionalized carbon nanostructure). The electrons in the n-type material can be transported to the anode and the corresponding holes can be transported to the cathode via the hole donor material.

The components of the photovoltaic device may be arranged in various configurations. In some cases, the electron acceptor material may be dispersed in clusters throughout the electron donor material. In some cases, the clusters may be substantially surrounded by an electron donor material. In some cases, the electron donor material and electron acceptor material may be randomly dispersed with respect to one another, thereby forming a heterogeneous material. In some cases, the electron donor material and/or the electron acceptor material can be formed as layers of films. In some cases, an array of different devices with different compositions and different morphologies or different layouts can be used. In some embodiments, the device may be configured such that the electron donor/electron acceptor materials are placed between two electrodes, e.g., a cathode and an anode. For example, the components of the device may be arranged to form a "normal" or "conventional" solar cell structure, i.e., where positive current may flow from the cathode of the solar cell device to an external circuit. Typically, indium tin oxide (ITO) is arranged as a cathode in a "normal" solar cell structure, though other materials may also be used as a cathode. An example of a "normal" solar cell structure is ITO cathode/electron blocking layer/active layer/hole blocking layer/Al anode, where the active layer contains an electron acceptor material and/or an electron donor material as described herein. In an illustrative embodiment, the device structure may be as follows: glass/ITO/PEDOT:PSS/P3HT:fullerene/Ca/Al.

In some embodiments, the components of the device may be arranged to form an "inverted" solar cell structure. In an "inverted" solar cell structure, positive current may flow from an external circuit into the anode of the solar cell device. Typically, ITO is arranged as an anode in an "inverted" solar cell structure. For example, the structure may include the following arrangement: ITO/hole blocking layer/active layer/electron blocking layer/Ag or Au, where Ag or Au are the cathodes and the active layer contains an electron acceptor material and/or an electron donor material as described herein. In an illustrative embodiment, the device structure may be as follows glass/ITO/ZnO/polymer:fullerene/Al/MoO$_3$/Ag.

Photovoltaic devices described herein may exhibit enhanced performance relative to previous photovoltaic devices. As described herein, incorporation of a carbon nanostructure containing a substituted isobenzofulvene group and/or a substituted indane group may raise the LUMO level of the electron acceptor material relative to an unsubstituted carbon nanostructure, thereby enhancing open-circuit potential (VOC) and efficiency of the device. In some embodiments, the photovoltaic device exhibits a higher efficiency relative to an essentially identical photovoltaic device lacking the substituted isobenzofulvene group and/or substituted indane group, under essentially identical conditions. In some embodiments, the photovoltaic device exhibits an efficiency that is about 1%, about 3%, about 5%, about 10%, about 20%, about 30%, about 40%, about 50%, about 60%, about 70%, about 80%, about 90%, or, in some cases, about 100% greater than that of an essentially identical photovoltaic device lacking the substituted isobenzofulvene group and/or substituted indane group, under essentially identical conditions.

As used herein, exposure to "conditions" or a "set of conditions" may comprise, for example, exposure to a particular temperature, pH, solvent, chemical reagent, type of atmosphere (e.g., nitrogen, argon, oxygen, etc.), source of external energy (e.g., voltage), or the like. Some embodiments may involve a set of conditions involving exposure to a source of external energy. The source of energy may comprise electromagnetic radiation, electrical energy, sound energy, thermal energy, or chemical energy. In some embodiments, the "conditions" may involve exposure to a particular potential, solvent, chemical species, and/or functional group precursor. Comparison of a first device and a second device under "essentially identical conditions" means placing the first and second devices under the substantially the same temperature, pH, solvent, chemical reagent, type of atmosphere, source of external energy, etc., for substantially the same period of time and observing the performance or behavior of the first and second devices. Devices are not placed under "essentially identical conditions" if, for example, a first device is exposed to a higher temperature, a different pH, a different chemical reagent, etc., or perhaps the same chemical reagent but at a different concentration, than a second device.

In some embodiments, the photovoltaic device exhibits a higher open circuit potential relative to an essentially identical photovoltaic device lacking the substituted isobenzofulvene group or substituted indane group, under essentially identical conditions. In some embodiments, the photovoltaic device exhibits an open circuit potential that is about 1%, about 3%, about 5%, about 10%, about 20%, about 30%, about 40%, about 50%, about 60%, about 70%, about 80%, about 90%, or, in some cases, about 100% greater than that of an essentially identical photovoltaic device lacking the substituted isobenzofulvene group or substituted indane group, under essentially identical conditions.

In some embodiments, the substituted isobenzofulvene group or substituted indane group is substituted with an electron-donating group. In some embodiments, the substituted isobenzofulvene group or substituted indane group is substituted with an electron-withdrawing group.

In some cases, the carbon nanostructure contains the following structure,

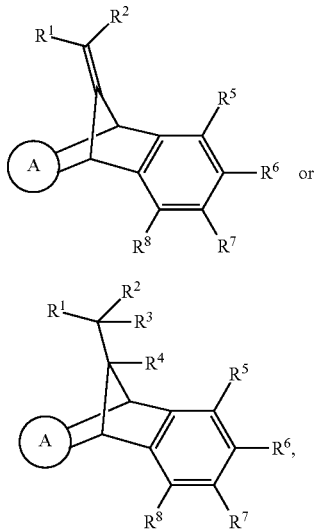

wherein:

A comprises the fused network of aromatic rings of the carbon nanostructure; and $R^1$-$R^8$ can be the same or different and are hydrogen, hydroxyl, halo, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring. In some cases, $R^1$ and $R^2$ are each independently alkyl. In some cases, $R^5$-$R^8$ are each hydrogen. In some cases, $R^1$-$R^8$ are not hydroxyl. In some cases, $R^1$-$R^8$ are not halo. For example, in some embodiments, $R^1$-$R^8$ are the same or different and are hydrogen, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

In one set of embodiments, the carbon nanostructure has a structure as in Formula (I), wherein $R^1$ and $R^2$ are each methyl and $R^5$-$R^8$ are each hydrogen.

In another set of embodiments, the carbon nanostructure has a structure as in Formula (II), wherein $R^1$, $R^2$, and $R^5$-$R^8$ can be the same or different and are hydrogen, hydroxyl, halo, alkyl, heteroalkyl, alkenyl, heteroalkenyl, aryl, heteroaryl, or heterocycle, any of which is optionally substituted, and $R^3$ and $R^4$ are joined together to form an epoxide ring. In some cases, the carbon nanostructure has a structure as in Formula (II), wherein $R^1$ and $R^2$ are each methyl, $R^3$ and $R^4$ are joined together to form an epoxide ring, and $R^5$-$R^8$ are each hydrogen.

In some cases, the carbon nanostructure is a fullerene, such as $C_{36}$, $C_{50}$, $C_{60}$, $C_{61}$, $C_{70}$, $C_{76}$, $C_{84}$, a metal derivative thereof, a substituted derivative thereof, or a mixture thereof.

In an illustrative embodiment, a device may include a fullerene appended with a substituted isobenzofulvene group and a polymeric electron donor material. Cofacial pi-interactions may occur between the olefin moiety and/or the phenyl moiety of the substituted isobenzofulvene group with the fused network of aromatic rings on the surface of the fullerene, resulting in significantly elevated LUMO energy levels and higher VOCs relative to those obtained from a similar device which includes PCBM instead of the fullerene containing the substituted isobenzofulvene group.

In some cases, a device may include a fullerene appended with an indane group comprising an epoxide moiety. Such a device may exhibit a relatively high IQE, and hence an improved JSC. In some cases, such devices may exhibit a slower recombination process relative to a device containing PCBM, resulting in an increase in VOC. As an illustrative embodiment, an increased JSC was observed for a device containing the following active layer, P3HT:IBF-Ep (FIG. 2C), relative to a device containing a P3HT:PCBM standard cell, resulting in ~15% enhanced PCE.

The carbon nanostructure may be, for example, a fullerene, a nanotube, graphene, or graphite. In some embodiments, the carbon nanostructure is a single-walled nanotube. In some embodiments, the carbon nanostructure is a multi-walled nanotube, such as a double-walled nanotube. In some embodiments, the carbon nanostructure is a fullerene. In some cases, the carbon nanostructure comprises one, two, three, four, five, or six substituted isobenzofulvene groups and/or substituted indane groups. It should be understood that the carbon nanostructure can include any number of optionally substituted isobenzofulvene and/or a substituted indane groups, and those of ordinary skill in the art would be capable of selecting the appropriate reaction conditions to produce a carbon nanostructure having the desired number of substituted isobenzofulvene and/or substituted indane groups.

In some embodiments, the carbon nanostructure includes an isobenzofulvene substituted with at least one alkyl group. In some embodiments, the carbon nanostructure includes an indane group substituted with at least one alkyl group (e.g., substituted at the 2-position of the indane moiety). In some embodiments, the carbon nanostructure is a fullerene that includes one, two, or three isobenzofulvene groups substituted with at least one (e.g., two) alkyl group. In some embodiments, the carbon nanostructure includes is a fullerene that includes one two or three isobenzofulvene groups substituted with at least one (e.g., two) alkyl group.

Methods for synthesizing functionalized carbon nanostructures, as well as methods for incorporating such materials into devices, are also provided. As used herein, the terms "substituted" and "functionalized" are given their ordinary meaning in the art and refer to species which have been altered (e.g., reacted) such that a new functional group (e.g., atom or chemical group) is bonded to the species. In some cases, the functional group may form a bond to one atom (e.g., a ring atom) of the carbon nanostructure. In some cases, the functional group may be fused to the carbon nanostructure via two atoms (e.g., two ring atoms) of the carbon nanostructure.

Carbon nanostructures may be functionalized with isobenzofulvene moieties using a variety of methods. The method may involve reaction of a carbon nanostructure with an isobenzofulvene group precursor to produce a functionalized carbon nanostructure comprising a substituted isobenzofulvene group. In some cases, the reaction involves a pericyclic reaction such as a Diels-Alder reaction. In some cases, the isobenzofulvene group precursor, or an intermediate produced by the isobenzofulvene group precursor, may act as a diene and the carbon nanostructure (e.g., fullerene) may serve as a dienophile in a Diels-Alder reaction. The reaction may be performed in the presence of an additive that may enhance and/or facilitate the pericyclic reaction.

Some embodiments may involve formation of an isobenzofulvene group precursor in situ, followed by addition of the carbon nanostructure to form a carbon nanostructure functionalized with an isobenzofulvene group (e.g., a substituted isobenzofulvene group). The isobenzofulvene group precursor may be a species that serves as a diene in a Diels-Alder reaction with a carbon nanostructure. In some cases, the isobenzofulvene group precursor prepared in situ has the following structure,

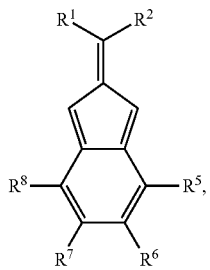

wherein $R^1$, $R^2$, and $R^5$-$R^8$ can be the same or different and are hydrogen, hydroxyl, halo, alkyl, heteroalkyl, alkenyl, heteroalkenyl, aryl, heteroaryl, or heterocycle, any of which is optionally substituted, provided that at least one of $R^1$, $R^2$, and $R^5$-$R^8$ is not hydrogen.

Figure 2A:
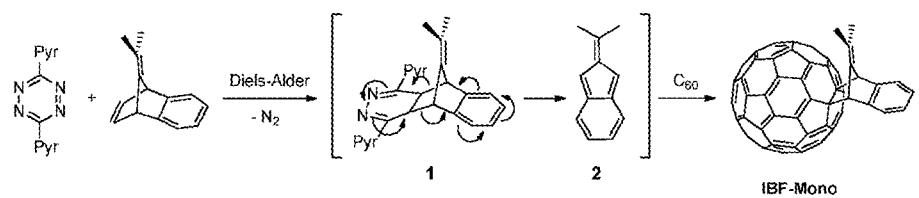
FIG. 2 shows the synthesis of (a) $C_{60}$ substituted with an isobenzofulvene group; (b) $C_{60}$ substituted with two isobenzofulvene groups; (c) $C_{60}$ substituted with an epoxidized isobenzofulvene group; (d) $C_{60}$ substituted with an isobenzofulvene group and an epoxidized isobenzofulvene group; and (e) $C_{60}$ substituted with two epoxidized isobenzofulvene groups.
Figure 2B:
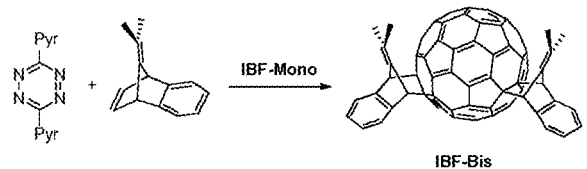

FIG. 2A shows an illustrative embodiment in which an isobenzofulvene group precursor, which may act as a diene, is produced in situ via the reaction between 9-isopropylidenebenzonorborna-diene and 3,6-di-2-pyridyl-1,2,4,5-tetrazine, followed by electrocyclic fragmentation of $N_2$. Addition of $C_{60}$, a dienophile, to the reaction mixture may produce $C_{60}$ adduct comprising a substituted isobenzofulvene group. In some cases, the Diels-Alder reaction may be performed at low temperature (e.g., 0° C. to room temperature). The reactions may be performed in the presence of one or more solvents, including organic solvents. The products may be isolated using known techniques, such as column chromatography.

The carbon nanostructure may include one or more functional groups which may be further reacted to attach additional groups to the carbon nanostructure. For example, the substituted isobenzofulvene and/or substituted indane group(s) may serve as a precursor for a wide range of additional functional groups that may be incorporated onto (e.g., bonded to) the carbon nanostructure. This may allow for the facile tailoring of various properties of carbon nanostructures, including stability, solubility, miscibility, biocompatibility, optical properties, electronic properties (e.g., electron affinity), binding properties, surface affinities, and the like. In one set of embodiments, a carbon nanostructure may be functionalized with various alkyl groups, which may increase the solubility of the carbon nanostructure in organic solvents such as chloroform, dichloromethane, and toluene. In some embodiments, the functionalization of carbon nanostructures may be readily reversible, which can be useful in applications such as exfoliation or deaggregation of carbon nanostructures.

In some cases, the functionalized carbon nanostructure may be further reacted to attach additional functional groups and/or replace existing functional groups with new atoms or groups. That is, at least one atom or chemical group of the functionalized carbon nanostructure may be replaced with a second, different atom or chemical group, or at least one atom or chemical group of the functionalized carbon nanostructure may be linked to a second, different atom or chemical group. In some embodiments, the carbon nanostructure may be first functionalized with a substituted isobenzofulvene group, which may be further reacted, for example, via a double bond of the isobenzofulvene group.

Further functionalization or reaction of the functionalized carbon nanostructure (e.g., via the substituted isobenzofulvene group) may be performed using various chemical reactions known in the art, where reaction components are selected to react together in a manner that produces a desired chemical bond. Such reactions are known in the art, for example, in "Advanced Organic Chemistry" by Carey and Sundberg and in "Advanced Organic Chemistry" by Jerry March, the contents of which are incorporated herein by reference. Some specific examples of reactions that may be useful in methods described herein include substitutions, eliminations, additions, condensations, aromatic substitutions, pericyclic reactions and cycloadditions, photochemical reactions, thermal reactions, Wittig reactions, metal-catalyzed reactions, rearrangement reactions, reductions, oxidations, and the like. In some cases, a functionalized carbon nanostructure may be reacted via heating, exposure to acid or base, or via a photochemical reaction.

In some embodiments, the method may involve reacting the functionalized carbon nanostructure under conditions which result in the conversion of the substituted isobenzofulvene group to a substituted indane group. For example, the functionalized carbon nanostructure may be exposed to a peroxide-containing reagent, resulting in epoxidation of the substituted isobenzofulvene group. Various peroxide-containing reagents are known in the art, including meta-chloroperoxybenzoic acid (mCPBA).

Chemical reactions may be selected to be compatible with (e.g., inert to) other functional groups that may be present during the reaction. In some embodiments, the chemical reaction may be selected to be compatible with carbon nanostructures. In some embodiments, protecting groups may be used to prevent reaction at sites other than the desired reactive site. The phrase "protecting group" as used herein refers to temporary substituents which protect a potentially reactive functional group from undesired chemical transformations. Examples of such protecting groups include esters of carboxylic acids, silyl ethers of alcohols, and acetals and ketals of aldehydes and ketones, respectively. The field of protecting group chemistry has been reviewed (Greene, T. W.; Wuts, P. G. M. Protective Groups in Organic Synthesis, 2nd ed.; Wiley: New York, 1991). In some cases, protecting groups may impart other beneficial characteristics, including improved solubility of a compound in a particular solvent.

Those of ordinary skill in the art would be able to select the appropriate set of conditions under which to conduct the reaction to produce a particular desired product. The set of conditions may include, for example, a particular temperature, pH, solvent, chemical reagent, type of atmosphere (e.g., nitrogen, argon, oxygen, etc.), the presence or absence of water, the relative ratio of reagents used, reaction time, and/or the like. For example, the chemical stability of the reaction components may affect the selection of reaction conditions. In some cases, it may be advantageous to perform the reaction under substantially moisture-free conditions. In some cases, the reaction may advantageously be performed with relatively short reaction times (e.g., 2 hours or less) and/or at relatively low temperatures (e.g., between 0° C. and room temperature).

Electron donor materials used in photovoltaic devices may include a conducting polymer. Conducting polymers refer to extended molecular structures comprising a conjugated backbone (e.g., pi-conjugated backbone, sigma-conjugated backbone, etc.), where "backbone" refers to the longest continuous bond pathway of the polymer. Polymers may also include oligomers. Typically, conducting polymers include at least one portion along which electron density or electronic charge can be conducted, where the electronic charge is delocalized. For example, in pi-conjugated systems, p-orbitals of one monomer have sufficient overlap with p-orbitals of an adjacent monomer such that electronic charge may be delocalized. In some cases, a conjugated pi-backbone includes a plane of atoms directly participating in the conjugation, wherein the plane arises from a preferred arrangement of p-orbitals to maximize p-orbital overlap, thus maximizing conjugation and electronic conduction. The conducting polymer may be a homopolymer, a copolymer including random copolymers and block copolymers, and the like. Examples of conducting polymers include polyaniline, polythiophene, polypyrrole, polyphenylene, polyarylene, poly(bisthiophene phenylene), a ladder polymer, poly(arylene vinylene), poly(arylene ethynylene), metal derivatives thereof, or substituted derivatives thereof.

In some embodiments, the conducting polymer may be polythiophene or a substituted derivative thereof. Poly(thiophenes) generally contain the repeating unit:

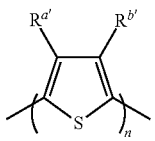

wherein $R^{a'}$ and $R^{b'}$ can be the same or different and each can independently be hydrogen, alkyl, heteroalkyl aryl, heteroaryl, arylalkyl, arylheteroalkyl, heteroarylalkyl, each optionally substituted; and n can be any integer between 2 and 100,000,000. In some embodiments, at least one of $R^{a'}$ and $R^{b'}$ is not hydrogen. In some cases, the polythiophene has the structure.

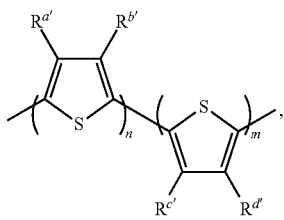

wherein $R^{a'}$, $R^{b'}$, $R^{c'}$, and $R^{d'}$ can be the same or different and each can independently be hydrogen, alkyl, heteroalkyl aryl, heteroaryl, arylalkyl, arylheteroalkyl, heteroarylalkyl, each optionally substituted; and n and m can be the same or different and can be any integer between 2 and 100,000,000. Examples of poly(thiophenes) include alkyl-substituted poly (thiophene)s (e.g., poly(3-hexylthiophene), poly(3,4-ethylenedioxythiophene) (PEDOT), etc.). In an illustrative embodiment, the polymer is poly(3-hexylthiophene).

As described herein, the electron donor material may also comprise a low band gap polymer.

In some cases, the substrate may comprise an electrically conductive material. In some cases, the substrate may comprise a material coated with an electrically conductive material, such that the photoactive material may be formed in contact with the electrically conductive material. Examples of materials suitable for use as a substrate include, but are not limited to, metals, such as nickel, chromium, gold, molybdenum, tungsten, platinum, titanium, aluminum, copper, palladium, silver, other metals and/or metal compounds, alloys thereof, intermetallic compounds thereof, and the like. Other materials may also be useful, including indium tin oxide (ITO).

The substrate may also comprise a flexible material, such as plastics (e.g., polymer), polymer films, flexible glass films, metal foil, paper, woven materials, combinations thereof, and the like. The substrate may be a flexible material coated with an electrically conductive material, for example. The substrate may be prepared, for example, by one of a number of micromachining methods known to those skilled in the art. Examples of such methods include, for instance, photofabrication, etching, electrodischarge machining, electrochemical machining, laser beam machining, wire electrical discharge grinding, focused ion beam machining, micromilling, micro-ultrasonic machining, and micropunching. The dimensions of the substrate may be any length, width, and thickness that is desired for a particular end use and may be rectangular, circular or otherwise shaped.

As used herein, the term "fullerene" is given its ordinary meaning in the art and refers to a substantially spherical molecule generally comprising a fused network of five-membered and/or six-membered aromatic rings. For example, $C_{60}$ is a fullerene which mimics the shape of a soccer ball. The term fullerene may also include molecules having a shape that is related to a spherical shape, such as an ellipsoid. It should be understood that the fullerene may comprise rings other than five- and six-membered rings. In some embodiments, the fullerene may comprise seven-membered rings, or larger. Fullerenes may include $C_{36}$, $C_{50}$, $C_{60}$, $C_{61}$, $C_{70}$, $C_{76}$, $C_{84}$, metal derivatives thereof, substituted derivatives thereof, and the like. In some embodiments, the device may include a mixture of different fullerenes. Fullerenes may also comprise individual atoms, ions, metals, nanoparticles, and/or clusters in the inner cavity of the fullerene, i.e., may be endohedral fullerenes. A non-limiting example of a substituted fullerene which may be used as the n-type material is phenyl-$C_{61}$-butyric acid methyl ester.

The term "electron-donating group," as used herein, refers to a functionality which draws electrons to itself less than a hydrogen atom would at the same position. Exemplary electron-donating groups include alkyl, amino, methoxy, and the like.

The term "electron-withdrawing group" is recognized in the art and as used herein means a functionality which draws electrons to itself more than a hydrogen atom would at the same position. Exemplary electron-withdrawing groups include nitro, cyano, carbonyl groups (e.g., aldehydes, ketones, esters, etc.), sulfonyl, trifluoromethyl, and the like.

As used herein, the term "react" or "reacting" refers to the formation of a bond between two or more components to produce a stable, isolable compound. For example, a first component and a second component may react to form one reaction product comprising the first component and the second component joined by a covalent bond. The term "reacting" may also include the use of solvents, catalysts, bases, ligands, or other materials which may serve to promote the occurrence of the reaction between component(s). A "stable, isolable compound" refers to isolated reaction products and does not refer to unstable intermediates or transition states.

The term "alkyl" refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. The alkyl groups may be optionally substituted, as described more fully below. Examples of alkyl groups include, but are not limited to, methyl, ethyl, propyl, isopropyl, butyl, isobutyl, tert-butyl, 2-ethylhexyl, cyclopropyl, cyclobutyl, cyclopentyl, cyclohexyl, and the like. "Heteroalkyl" groups are alkyl groups wherein at least one atom is a heteroatom (e.g., oxygen, sulfur, nitrogen, phosphorus, etc.), with the remainder of the atoms being carbon atoms. Examples of heteroalkyl groups include, but are not limited to, alkoxy, poly(ethylene glycol)-, alkyl-substituted amino, tetrahydrofuranyl, piperidinyl, morpholinyl, etc.

The terms "alkenyl" and "alkynyl" refer to unsaturated aliphatic groups analogous to the alkyl groups described above, but containing at least one double or triple bond respectively. The "heteroalkenyl" and "heteroalkynyl" refer to alkenyl and alkynyl groups as described herein in which one or more atoms is a heteroatom (e.g., oxygen, nitrogen, sulfur, and the like).

The term "aryl" refers to an aromatic carbocyclic group having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl), all optionally substituted. "Heteroaryl" groups are aryl groups wherein at least one ring atom in the aromatic ring is a heteroatom, with the remainder of the ring atoms being carbon atoms. Examples of heteroaryl groups include furanyl, thienyl, pyridyl, pyrrolyl, N lower alkyl pyrrolyl, pyridyl N oxide, pyrimidyl, pyrazinyl, imidazolyl, indolyl and the like, all optionally substituted.

The terms "amine" and "amino" refer to both unsubstituted and substituted amines, e.g., a moiety that can be represented by the general formula: N(R')(R'')(R''') wherein R', R'', and R''' each independently represent a group permitted by the rules of valence.

The terms "acyl," "carboxyl group," or "carbonyl group" are recognized in the art and can include such moieties as can be represented by the general formula:

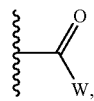

wherein W is H, OH, O-alkyl, O-alkenyl, or a salt thereof. Where W is O-alkyl, the formula represents an "ester." Where W is OH, the formula represents a "carboxylic acid." In general, where the oxygen atom of the above formula is replaced by sulfur, the formula represents a "thiolcarbonyl" group. Where W is a S-alkyl, the formula represents a "thiolester." Where W is SH, the formula represents a "thiolcarboxylic acid." On the other hand, where W is alkyl, the above formula represents a "ketone" group. Where W is hydrogen, the above formula represents an "aldehyde" group.

As used herein, the term "heterocycle" or "heterocyclyl" refers to a monocyclic or polycyclic heterocyclic ring that is either a saturated ring or an unsaturated non-aromatic ring. Typically, the heterocycle may include 3-membered to 14-membered rings. In some cases, 3-membered heterocycle can contain up to 3 heteroatoms, and a 4- to 14-membered heterocycle can contain from 1 to about 8 heteroatoms. Each heteroatom can be independently selected from nitrogen, which can be quaternized; oxygen; and sulfur, including sulfoxide and sulfone. The terms "heterocycle" or "heterocyclyl" may include heteroaromatic or heteroaryl groups, as described more fully below. The heterocycle may be attached via any heteroatom ring atom or carbon ring atom. Representative heterocycles include morpholinyl, thiomorpholinyl, pyrrolidinonyl, pyrrolidinyl, piperidinyl, piperazinyl, hydantoinyl, valerolactamyl, oxiranyl, oxetanyl, tetrahydrofuranyl, tetrahydropyranyl, tetrahydropyrindinyl, tetrahydropyrimidinyl, tetrahydrothiophenyl, tetrahydrothiopyranyl, and the like. A heteroatom may be substituted with a protecting group known to those of ordinary skill in the art, for example, the hydrogen on a nitrogen may be substituted with a tert-butoxycarbonyl group. Furthermore, the heterocyclyl may be optionally substituted with one or more substituents (including without limitation a halogen atom, an alkyl radical, or aryl radical).

As used herein, the term "heteroaromatic" or "heteroaryl" means a monocyclic or polycyclic heteroaromatic ring (or radical thereof) comprising carbon atom ring members and one or more heteroatom ring members (such as, for example, oxygen, sulfur or nitrogen). Typically, the heteroaromatic ring has from 5 to about 14 ring members in which at least 1 ring member is a heteroatom selected from oxygen, sulfur, and nitrogen. In another embodiment, the heteroaromatic ring is a 5 or 6 membered ring and may contain from 1 to about 4 heteroatoms. In another embodiment, the heteroaromatic ring system has a 7 to 14 ring members and may contain from 1 to about 7 heteroatoms. Representative heteroaryls include pyridyl, furyl, thienyl, pyrrolyl, oxazolyl, imidazolyl, indolizinyl, thiazolyl, isoxazolyl, pyrazolyl, isothiazolyl, pyridazinyl, pyrimidinyl, pyrazinyl, triazinyl, triazolyl, pyridinyl, thiadiazolyl, pyrazinyl, quinolyl, isoquinolyl, indazolyl, benzoxazolyl, benzofuryl, benzothiazolyl, indolizinyl, imidazopyridinyl, isothiazolyl, tetrazolyl, benzimidazolyl, benzoxazolyl, benzothiazolyl, benzothiadiazolyl, benzoxadiazolyl, carbazolyl, indolyl, tetrahydroindolyl, azaindolyl, imidazopyridyl, qunizaolinyl, purinyl, pyrrolo[2,3]pyrimidyl, pyrazolo[3,4]pyrimidyl, benzo(b)thienyl, and the like. These heteroaryl groups may be optionally substituted with one or more substituents.

The term "substituted" is contemplated to include all permissible substituents of organic compounds, "permissible" being in the context of the chemical rules of valence known to those of ordinary skill in the art. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl" must still comprise the phenyl moiety and cannot be modified by substitution, in this definition, to become, e.g., a heteroaryl group such as pyridine. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

Examples of substituents include, but are not limited to, alkyl, aryl, aralkyl, cyclic alkyl, heterocycloalkyl, hydroxy, alkoxy, aryloxy, perhaloalkoxy, aralkoxy, heteroaryl, heteroaryloxy, heteroarylalkyl, heteroaralkoxy, azido, amino, halogen, alkylthio, oxo, acyl, acylalkyl, carboxy esters, carboxyl, carboxamido, nitro, acyloxy, aminoalkyl, alkylaminoaryl, alkylaryl, alkylaminoalkyl, alkoxyaryl, arylamino, aralkylamino, alkylsulfonyl, carboxamidoalkylaryl, carboxamidoaryl, hydroxyalkyl, haloalkyl, alkylaminoalkylcarboxy, aminocarboxamidoalkyl, alkoxyalkyl, perhaloalkyl, arylalkyloxyalkyl, and the like.

Having thus described several aspects of some embodiments of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

EXAMPLES AND EMBODIMENTS

Materials. $C_{60}$ was purchased from SES Research. $PC_{61}BM$ and P3HT were purchased from Sigma-Aldrich. PEDOT/PSS were purchased from Ossila. 3,6-Di-2-pyridyl-1,2,4,5-tetrazine was purchased from Alfa Aesar. All the compounds purchased from commercial sources were used as received. Other materials including solvents and electrolyte salt were commercially available. Anhydrous solvents were obtained from a solvent purification system (Innovative Technologies).

Measurements. Reaction mixtures containing multiadducts of fullerenes were separated by 5PBB Cosmosil column (10 mm×250 mm) from Nacalai Tesque, Inc. installed in Agilent Technologies ProsStar 210 High Pressure Liquid Chromatography (HPLC) system. $^1H$ and $^{13}C$ NMR spectra were taken on Varian Inova-500 spectrometers. Chemical shifts were reported in ppm and referenced to residual solvent peaks ($CD_2Cl_2$: 5.33 ppm for $^1H$, 53.84 ppm for $^{13}C$, $CDCl_3$: 7.26 ppm for $^1H$, 77.16 ppm for $^{13}C$). Bruker Daltonics Omniflex MALDI-TOF mass spectrometer was used for mass determination without the use of matrix. UV-Vis absorption spectra were obtained using a Cary 4000 UV-Vis spectrophotometer. Electrochemical measurements were carried out in a glove box under nitrogen, using an Autolab PGSTAT 10 or PGSTAT 20 potentiostat (Eco Chemie) in a three-electrode cell configuration. A Pt button (1.6 mm in diameter) electrode, a Pt wire, and a quasi-internal Ag wire submerged in 0.01M $AgNO_3$/0.1M tetrabutylammonium hexafluorophosphate ($TBAPF_6$) in acetonitrile were used as a working electrode, a counter electrode, and a reference electrode, respectively, in 0.1M $TBAPF_6$ toluene/acetonitrile (4:1) solution. The ferrocene/ferrocenium (Fc/$Fc^+$) redox couple was used as an internal standard, with the half-wave potentials observed between 0.193-0.205 V vs Ag/$Ag^+$ in toluene/acetonitrile (4:1) solution. Differential Scanning Calorimetry (DSC) was measured on a TA Instruments Q1000 DSC at scan rate of 10° C./min over the range of 25° C. to 200° C. or 35° C. to 200° C.

Synthesis. Various substituted fullerenes were synthesized as shown in FIG. 2. The [4+2]-cycloaddition reaction was conducted using two equivalents of isobenzofulvene reagent relative to $C_{60}$ at low temperatures (e.g., 0° C. to room temperature). The reaction mixture consisted of monoadduct with bisadduct. The major product, isobenzofulvene monoadduct (IBF-Mono), was easily purified via silica column chromatography with the elution of $CS_2$/hexane solvent mixture. The yield of the bisadducts (IBF-Bis) increased when the isobenzofulvene reacted with IBF-Mono instead of $C_{60}$ as a dienophile. (FIG. 1B). The bisadducts were comprised of multiple regioisomers, as observed by NMR, and exhibited enhanced solubility relative to the mono-adduct in many organic solvents including dichloromethane, chloroform, toluene, and o-dichlorobenzene. The bis-adduct was purified by HPLC using a 5PBB Cosmosil column with toluene elution. With 56 pi electrons, the bisadducts were expected to possess elevated LUMO energy levels and higher VOC compared to those of the monoadducts, as observed for other fullerene bisadducts.

Figure 2C:
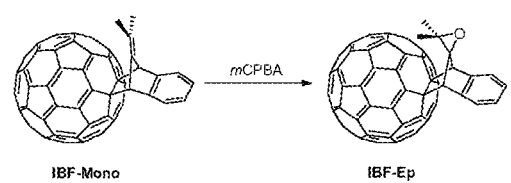
Figure 2D:
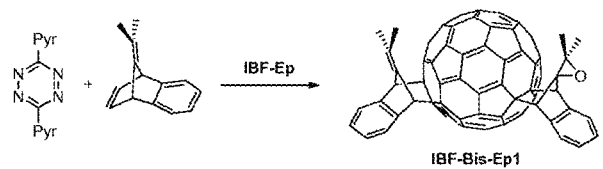
Figure 2E:
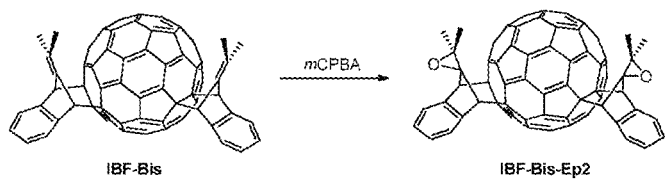

Epoxidation of the monoadduct was successfully conducted and generated a product (IBF-Ep) as shown in FIG. 2C. IBF-Ep showed increased solubility in organic solvents compared to that of IBF-Mono, due at least in part to higher polarity imparted by the epoxide oxygen. Epoxide derivatives of IBF-Bis were also synthesized, with one or two epoxidized isobenzofulvene moieties in order to take advantage of high VOC characteristics of the 56 pi electron system and to observe the effect of epoxide groups on JSC. (FIG. 2-D-E) For the optimal yields and ease of purification, IBF-Bis-Ep1 was synthesized by adding an isobenzofulvene addend to IBF-Ep scaffold, and IBF-Bis-Ep2 was prepared by the complete epoxidation of IBF-Bis.

Example 1

Synthesis of 9-Isopropylidenebenzonorbornadiene

The compound was prepared according to a modified version of the procedure described in Lombardo, L.; Wege, D.; Wilkinso. Sp Aust J Chem 1974, 27, 143. To a refluxing solution of 6,6-dimethylfulvene (5.00 g, 5.7 mL, 47 mmol) and isoamyl nitrite (8.3 g, 9.5 mL, 71 mmol) in 1,2-dichloroethane (40 mL) was added dropwise a solution of anthranilic acid (9.7 g, 71 mmol) in 30 mL acetone. The mixture was then refluxed for 90 minutes before removing the solvents under reduced pressure and extracting with boiling hexanes. The product was chromatographed on a column of silica gel (hexanes, $R_f$=0.25) and recovered as a colorless powder (3.4 g, 40%).

Example 2

Synthesis of IBF-Mono

In a 200 mL round-bottom flask, 3,6-Di-2-pyridyl-1,2,4,5-tetrazine (396 mg, 1.67 mmol) was dissolved in dichloromethane (25 mL) and stirred at 0° C. under air. 9-Isopropylidenebenzonorbornadiene (305 mg, 1.67 mmol) was dissolved in toluene (10 mL) and added to the tetrazine solution dropwise. The solution was stirred for 30 min and turned lighter, and then toluene/o-dichlorobenzene solution (70 mL/10 mL) of $C_{60}$ (602 mg, 0.835 mmol) was added. After overnight stirring, the solution was evaporated under reduced pressure. Ethanol (400 mL) was poured into the reaction mixture to precipitate brown solid. The solid was purified via $SiO_2$ column chromatography with $CS_2$/hexane (1:3 v/v) elution, and 170 mg (23.2%) of product was obtained. $^1H$ NMR (500 MHz, $CD_2Cl_2/CS_2$, δ): 7.67 (dd, 2H), 7.46 (dd, 2H), 5.43 (s, 2H), 2.20 (s, 6H) $^{13}C$ NMR (500 MHz, $CDCl_3/CS_2$, δ): 192.35 ($CS_2$), 155.63, 153.70, 147.08, 146.12, 146.01, 146.00, 145.92, 145.86, 145.55, 145.43, 145.22, 145.19, 145.18, 145.10, 144.95, 144.94, 144.45, 144.26, 142.47, 142.43, 142.34, 142.13, 142.00, 141.87, 141.73, 141.60, 141.50, 139.81, 139.53, 137.81 (1C), 137.16

(1C), 127.11 (2C), 123.21 (2C), 120.13 (2C), 77.11 (CDCl$_3$), 75.16 (2C), 57.96 (2C), 20.75 (2C). MS (MALDI-TOF, m/z): [M+H]$^+$ calcd for C$_{72}$H$_{12}$, 877.1017; found, 876.9678.

Example 3

Synthesis of IBF-Bis

In a 100 mL round-bottom flask, 3,6-Di-2-pyridyl-1,2,4,5-tetrazine (40 mg, 0.17 mmol) was dissolved in dichloromethane (8 mL) and stirred at room temperature. 9-Isopropylidenebenzonorbornadiene (31 mg, 0.17 mmol) was dissolved in toluene and added to the tetrazine solution dropwise. The solution was stirred for 30 min, and the CS$_2$ solution (10 mL) of IBF-Mono (150 mg, 0.17 mmol) was added. After overnight stirring, the solution was evaporated under reduced pressure. The reaction mixture was dissolved in toluene and purified by HPLC with 5PBB Cosmosil column (toluene/hexane 1:1 elution). For the further purification, the product was passed through SiO$_2$ column with CS$_2$/hexane (1:3 v/v) elution, and 40 mg (22.8%) of product was obtained. $^1$H NMR (500 MHz, CD$_2$Cl$_2$/CS$_2$, δ): 7.94-7.24 (m, 8H), 5.74-5.02 (m, 4H), 2.40-1.89 (12H). $^{13}$C NMR (500 MHz, CD$_2$Cl$_2$/CS$_2$, δ): 192.92 (CS$_2$), 160-140 (C$_{60}$, sp$^2$), 140-130 (alkene), 130-115 (aromatic), 80-70 (C$_{60}$, sp$^3$), 60-55 (bridgehead), 30.47 (grease), 22-20 (CH$_3$). MS (MALDI-TOF, m/z): [M]$^+$ calcd for C$_{84}$H$_{24}$, 1032.1878; found, 1032.5122.

Example 4

Synthesis of IBF-Ep

IBF-Mono (170 mg, 0.194 mmol) was dissolved in CS$_2$ (25 mL) in a 100 mL round-bottom flask in which a solution of 3-chloroperbenzoic acid (max. 77% purity, 130 mg, 0.753 mmol) in dichloromethane (20 mL) was added dropwise at room temperature. After overnight stirring, a major product spot was detected on a TLC plate. The reaction mixture was dried under reduced pressure, re-dissolved in dichloromethane (30 mL), and extracted with NaOH aqueous solution several times. The organic layer was dried with MgSO$_4$ and concentrated in vacuo. 94.0 mg (54.3%) of the product was isolated after gradient silica column with 1:1 to 3:1 toluene/hexane elution. $^1$H NMR (500 MHz, CD$_2$Cl$_2$/CS$_2$, δ): 7.75 (dd, 2H), 7.55 (dd, 2H), 4.78 (s, 2H), 1.87 (s, 6H). $^{13}$C NMR (500 MHz, CD$_2$Cl$_2$/CS$_2$, δ): 192.92 (CS$_2$), 155.07, 153.74, 147.78, 146.81, 146.66, 146.61, 146.54, 146.19, 146.13, 146.00, 145.89, 145.79, 145.78, 145.69, 145.68, 145.09, 144.91, 144.61, 143.39, 143.11, 143.02, 142.45, 142.40, 142.38, 142.25, 142.20, 14.062, 140.29, 137.90, 137.60 (2C), 128.33 (2C), 125.18 (2C), 87.59 (1C), 72.99 (2C), 66.01 (1C), 58.42 (2C), 30.46 (grease), 23.74 (2C). MS (MALDI-TOF, m/z): [M]$^+$ calcd for C$_{72}$H$_{12}$O, 892.0888; found, 892.4482.

Example 5

Synthesis of IBF-Bis-Ep1

In a 50 mL round-bottom flask, 3,6-Di-2-pyridyl-1,2,4,5-tetrazine (10.9 mg, 0.046 mmol) was dissolved in dichloromethane (2 mL) and stirred at 0° C. under air. 9-Isopropylidenebenzonorbornadiene (8.4 mg, 0.046 mmol) was dissolved in dichloromethane (5 mL) and added to the tetrazine solution dropwise. The solution was stirred for 1 h and turned lighter, and then IBF-Ep (41 mg, 0.046 mmol) dissolved in CS$_2$ (5 mL) was added to the solution dropwise. After overnight stirring, the solution was concentrated in vacuo. The product was purified by silica column chromatography by the elution of dichloromethane/hexane (1:2), and further purified by HPLC with SPBB Cosmosil column by toluene/hexane (1:1) elution. The purified product was obtained with the yield of 22.8% (11 mg). $^1$H NMR (500 MHz, CD$_2$Cl$_2$, δ): 7.61-7.32 (m, 8H), 5.13-4.33 (m, 4H), 2.05-1.61 (12H). $^{13}$C NMR (500 MHz, CD$_2$Cl$_2$, δ): 160-140 (C$_{60}$, sp$^2$), 140-130 (alkene), 130-115 (aromatic), 90-70 (epoxide), 70-65 (C$_{60}$, sp$^3$), 60-55 (bridgehead), 25-20 (CH$_3$). MS (MALDI-TOF, m/z): [M]$^+$ calcd for C$_{84}$H$_{24}$O, 1048.1827; found, 1048.3863.

Example 6

Synthesis of IBF-Bis-Ep2

IBF-Bis (26 mg, 0.025 mmol) was dissolved in dichloromethane (10 mL) in a 50 mL round-bottom flask in which a solution of 3-chloroperbenzoic acid (max. 77% purity, 34 mg, 0.197 mmol) in dichloromethane (10 mL) was added dropwise at room temperature. After overnight stirring, a major product spot was detected on a TLC plate. The reaction mixture was extracted with NaOH aqueous solution several times. The organic layer was dried with MgSO$_4$ and concentrated in vacuo. 14 mg (52.2%) of the product was isolated after gradient silica column with 2:1 dichloromethane/hexane and 100% dichloromethane elution. $^1$H NMR (500 MHz, CD$_2$Cl$_2$, δ): 7.91-7.34 (m, 8H), 4.79-4.35 (m, 4H), 2.05-1.70 (12H). $^{13}$C NMR (500 MHz, CD$_2$Cl$_2$, δ): 160-140 (C$_{60}$, sp$^2$), 140-120 (aromatic), 90-85 (epoxide), 75-70 (C$_{60}$, sp$^3$), 70-65 (epoxide), 60-55 (bridgehead), 25-20 (CH$_3$). MS (MALDI-TOF, m/z): [M+H]$^+$ calcd for C$_{84}$H$_{24}$O$_2$, 1065.1855; found, 1065.4214.

Example 7

Device Fabrication and Characterization

Pre-patterned indium tin oxide (ITO)-coated glass substrates (Thin Film Devices, Inc.) were sonicated in deionized water (10 min), acetone (10 min) and isopropanol (10 min) and oxygen plasma-cleaned (3 min) immediately prior to deposition of the PEDOT:PSS layer. PEDOT:PSS (2-5 wt % in water, Aldrich) was spin-coated at 4000 rpm and annealed at 150° C. (using a hotplate) for 20 min under nitrogen. For the active layer, a 25 mg/mL solution of 1:1 P3HT:fullerene in chlorobenzene (CB) was spin-coated onto the PEDOT:PSS layer at 1000 rpm under nitrogen and annealed on a 150° C. hotplate for 20 min under nitrogen. Finally 25 nm Ca followed by 100 nm Al electrode was deposited by thermal evaporation.

Current density-voltage (J-V) measurements were recorded by a Keithley 6487 picoammeter both in the dark and under illumination. The devices were illuminated through the glass substrate using an Oriel 91191 150 W full spectrum solar simulator. The illumination intensity was calibrated to 100 mW/cm$^2$ using an NREL-certified silicon photodiode. The optical absorption and photoluminescence spectra of devices were obtained by measuring the respectively transmittance and reflectance on glass substrates, using a Cary 5E UV-vis-NIR dual-beam spectrophotometer. For the external quantum efficiency spectrum measurements, the incident light was generated by a quartz tungsten halogen lamp, chopped at 40 Hz, dispersed by a monochromator, and conducted through an optical fiber to the sample surface. The light intensity was calibrated using a Newport silicon photodetector (for wavelength of 400-800 nm), and the photocurrent at a short-circuit condition was measured with a Stanford Research SR830 lock-in amplifier. Transient photocurrents and recombination lifetime measurement conducted with a Newport laser diode (830 nm) driven by an Agilent 33220A function generator was used as a second light source to provide square wave modulated illumination. This illumination was filtered through a neutral density filter before reaching the device to ensure a small illumination perturbation. Voc decay transients were recorded on a Tektronix TDS 3054B digital oscilloscope.

Example 8

Electrochemical Properties

Figure 3:
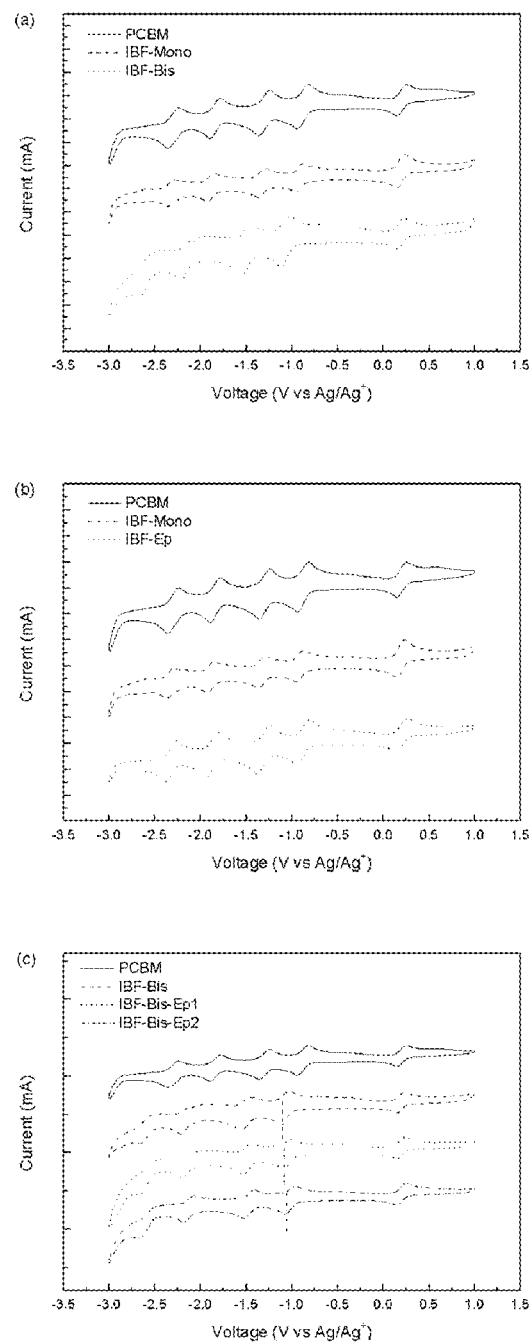
FIG. 3 shows cyclic voltammograms for (a) PCBM, IBF-Mono, and IBF-Bis; (b) PCBM, IBF-Mono, and IBF-Ep; and (c) PCBM, IBF-Bis, IBF-Bis-Ep1, and IBF-Bis-Ep2 (under nitrogen, 0.1M Bu$_4$NPF$_6$ in toluene/acetonitrile (4:1), Pt (WE), Pt wire (CE), Ag/AgNO$_3$ (RE), scan rate 0.1 V/s, Fc/Fc$^+$ internal standard E$^{1/2}$ at 0.20 V).
Figure 5:
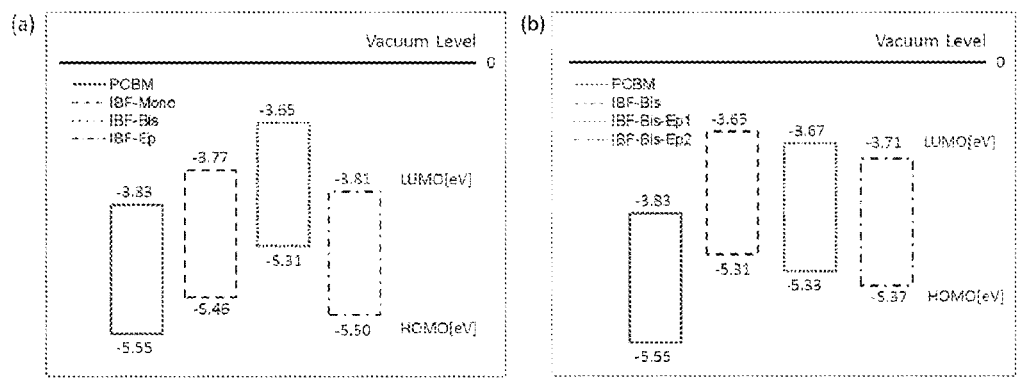
FIG. 5 shows the molecular orbital (MO) energy level diagrams for (a) various C$_{60}$ adducts such as IBF-Mono, IBF-Bis, and IBF-Ep and (b) IBF-Bis, IBF-Bis-Ep1, and IBF-Bis-Ep2.

Cyclic voltammetry was conducted to measure the relative reduction potentials of the $C_{60}$ derivatives in Examples 2-6 under anhydrous, air-free conditions with ferrocene/ferrocenium (Fc/Fc+) internal standard. In 0.1 M $TBAPF_6$ toluene/acetonitrile (4:1) solution, four reversible redox peaks were exhibited for each compound, and the relative positions of the onset reduction potentials were used to compare the LUMO energy levels of the fullerenes. FIG. 3 shows cyclic voltammograms for (a) PCBM, IBF-Mono, and IBF-Bis; (b) PCBM, IBF-Mono, and IBF-Ep; and (c) PCBM, IBF-Bis, IBF-Bis-Ep1, and IBF-Bis-Ep2 (under nitrogen, 0.1M $Bu_4NPF_6$ in toluene/acetonitrile (4:1), Pt (WE), Pt wire (CE), $Ag/AgNO_3$ (RE), scan rate 0.1 V/s, Fc/Fc$^+$ internal standard $E^{1/2}$ at 0.20 V). Relative to PCBM, the reduction onset potentials of IBF-Mono and IBF-Bis were shifted toward negative potentials by ca. 60 mV and 180 mV, similar to those of indene-$C_{60}$ mono- and bisadducts (50 mV and 170 mV, respectively). (FIG. 3A) FIG. 5 shows HOMO-LUMO energy diagrams for the functionalized fullerenes, with MO energy levels scaled relative to the vacuum level set to zero. Increasingly negative reduction potentials corresponded to raised LUMO levels, increasing the effective band gap and VOC of BHJ solar cells. Without wishing to be bound by theory, the pi-pi interaction between the $C_{60}$ surface and the attached functional groups (e.g., the aromatic ring and the double bond of the isobenzofulvene groups) may contribute to the large decrease of the electron affinity of fullerene.

Epoxidation of IBF-Mono essentially removed the pi-pi interaction between $C_{60}$ and the double bond of isobenzofulvene moiety, resulting in a slight increase in reduction potentials for IBF-Ep relative to those of IBF-Mono. (FIG. 3A) This may be attributed at least in part to the combined effects of the reduced pi-pi interaction and the presence of the electron-withdrawing epoxide group. Similar phenomena were observed for the epoxide derivatives of IBF-Bis. In FIG. 3C, the redox behaviors of IBF-Bis, IBF-Bis-Ep1, and IBF-Bis-Ep2 were plotted relative to PCBM. The first reduction peaks and the onset reduction potentials of the three compounds were very closely positioned, but there were slight differences as marked by the dotted lines for visual aids. As more epoxide groups were incorporated into the structure, the electron affinity of the fullerenes increased and the LUMO energy levels were lowered. (FIG. 5B)

Example 9

Photophysical and Thermal Properties

Figure 4:
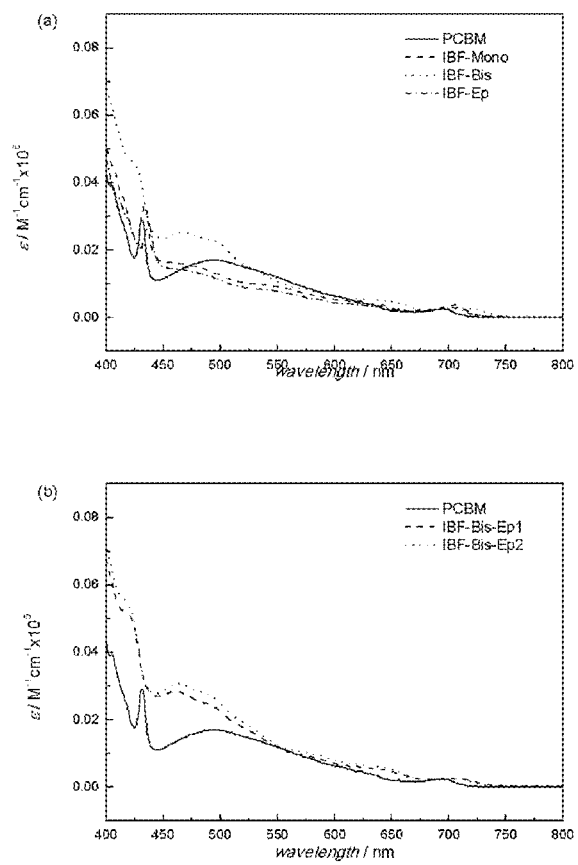
FIG. 4 shows the UV-Vis absorption spectra for (a) PCBM (2.4×10-5 M), IBF-Mono (2.2×10-5 M), IBF-Bis (2.4×10-5 M), and IBF-Ep (2.3×10-5 M); and (b) PCBM (2.4×10-5 M), IBF-Bis-Ep1 (2.4×10-5 M) and IBF-Bis-Ep2 (2.2×10-5 M), in CHCl$_3$.

UV-Vis spectroscopy was employed to study the optical properties of substituted fullerenes in solution state, since the absorption of visible light by the acceptors can contribute to the increased JSC of solar cells. The comparative absorption spectra of the $C_{60}$ derivatives in Examples 2-6 and PCBM were plotted over the range of 400-800 nm. FIG. 4 shows the UV-Vis absorption spectra for (a) PCBM (2.4×10-5 M), IBF-Mono (2.2×10-5 M), IBF-Bis (2.4×10-5 M), and IBF-Ep (2.3×10-5 M); and (b) PCBM (2.4×10-5 M), IBF-Bis-Ep1 (2.4×10-5 M) and IBF-Bis-Ep2 (2.2×10-5 M), in $CHCl_3$. The monoadducts (IBF-Mono, IBF-Ep) exhibited weak spikes around 430-440 nm which are characteristic of fullerene derivatives formed by 1,2-addition reactions. The spikes and the absorption onset wavelengths, $\lambda_{onset}$, of the monoadducts were red-shifted from those of PCBM. The bisadducts showed broader absorption characteristics than the monoadducts since they were in the form of regioisomer mixtures, and higher absorptivity was imparted by the lowered symmetry of the fullerenes. Longer onset wavelengths and smaller band gaps were observed for the bisadducts compared to the monoadducts. The band gaps were used to approximate the HOMO energy levels of the fullerenes (e.g., by subtracting band gaps from the LUMO levels derived from cyclic voltammetry). The values obtained from the above-mentioned experiments are summarized in Table 1, and the MO energy level diagrams of the fullerenes are depicted in FIG. 5.

TABLE 1

HOMO and LUMO energies of fullerene derivatives calculated from UV-Vis absorption and cyclic voltammetry

| $C_{60}$ Derivative | $E_1$ [V][a] | $E_2$ [V] | $E_3$ [V] | $E_{onset}$ [V][b] | LUMO [eV][c] | $\lambda_{onset}$ [nm] [d] | HOMO [eV][e] | $E_{gap}$ [eV][f] |
|---|---|---|---|---|---|---|---|---|
| PCBM | −0.94 | −1.35 | −1.89 | −0.77 | −3.83 | 723 | −5.55 | 1.72 |
| IBF-Mono | −0.95 | −1.36 | −1.92 | −0.83 | −3.77 | 737 | −5.46 | 1.69 |
| IBF-Bis | −1.12 | −1.54 | −2.22 | −0.95 | −3.65 | 750 | −5.31 | 1.66 |
| IBF-Ep | −0.95 | −1.38 | −1.94 | −0.79 | −3.81 | 733 | −5.50 | 1.70 |
| IBF-Bis-Ep1 | −1.09 | −1.53 | −2.20 | −0.93 | −3.67 | 749 | −5.33 | 1.66 |
| IBF-Bis-Ep2 | −1.07 | −1.52 | −2.19 | −0.89 | −3.71 | 749 | −5.37 | 1.66 |

[a]Half-wave potential, 0.5 (Ep.a. + Ep.c.); Ep.a., anodic peak potential; Ep.c. cathodic peak potential;
[b]Onset reduction potential;
[c]LUMO (eV) = −e ($E_{onset}$ + 4.60);
[d] Onset absorption wavelength;
[e]HOMO = LUMO − $E_{gap}$ [eV];
[f]Band gap = hc/$\lambda_{onset}$, converted [J] to [eV]; h, Planks constant; c, speed of light.

Thermal stability of the fullerenes was examined by differential scanning calorimetry (DSC) experiments from 25° C. to 200° C. Only PCBM, used as purchased from a commercial source, displayed a small endothermic peak around 140° C., which may be due to the loss of residual toluene. All the other fullerenes derivatives did not exhibit significant endothermic or exothermic features over three DSC cycles, confirming the thermal stability of the compounds and their compatibility with thermal annealing processes commonly used in organic photovoltaics fabrication procedures. The very small exothermic features observed on the first DSC cycles for IBF-Bis, IBF-Ep, and IBF-Bis-Ep1 from 120° C.-180° C. can be attributed to minor retro-Diels-Alder reactions at high temperatures, which is typical for fullerene cycloadducts.

Example 10

Photovoltaic Characterization

Figure 6:
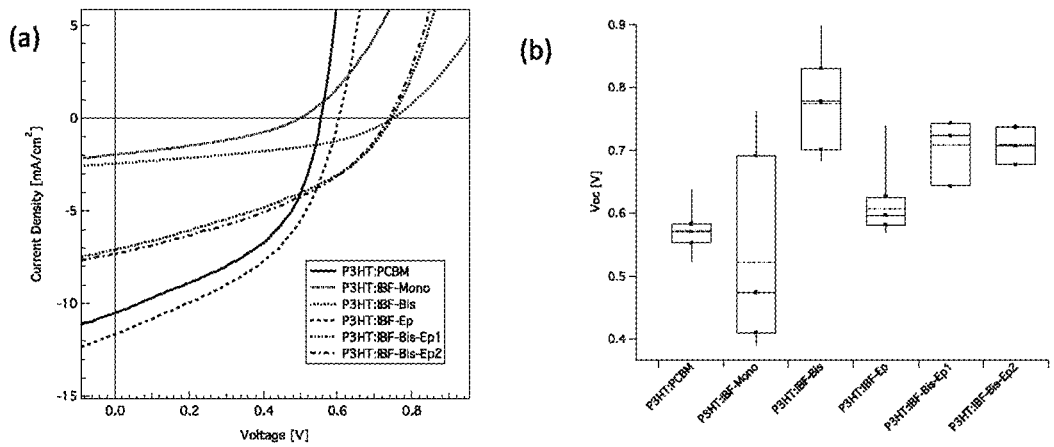
FIG. 6 shows (a) the current density as a function of applied voltage for the fullerenes in BHJ architecture for solar cells with P3HT as an electron donor, compared to conventional P3HT:PCBM, and (b) a box plot of the VOC values obtained from the devices in (a) where the whiskers were the 10th to 90th percentile and the box was the 25th and 75th percentile containing a median and average (dotted line).

In this example, IBF-Mono, IBF-Bis, IBF-Ep, IBF-Bis-Ep1, and IBF-Bis-Ep2 were used as electron acceptors in BHJ solar cells with a P3HT donor, and their performances were compared to conventional P3HT:PCBM devices. Experimental details of device fabrication can be found in Example 7. FIG. 6 shows (a) the current density as a function of applied voltage for the fullerenes in BHJ architecture for solar cells with P3HT as an electron donor, compared to conventional P3HT:PCBM, and (b) a box plot of the VOC values obtained from the devices in (a) where the whiskers were the 10th to 90th percentile and the box was the 25th and 75th percentile containing a median and average (dotted line). The relative parameters for FIG. 6 are listed in Table 2.

Except for P3HT:IBF-Mono, the median VOC for the devices with all the fullerenes were higher than conventional P3HT:PCBM devices. The replacement of PCBM with IBF-Mono and IBF-Bis generally reduced JSC. In particular, IBF-Mono had lower solubility compared to other fullerene adducts, and were thus more prone to current loss and low reproducibility. Epoxidation of the isobenzofulvene moieties improved JSC significantly as shown by the difference in currents between IBF-Bis and IBF-Bis-Ep1/IBF-Bis-Ep2. Moreover, the epoxidation of IBF-Mono (to produce IBF-Ep) not only generated much higher current in a device than that of P3HT:PCBM, but also increased the solubility of IBF-Mono and the reproducibility of the J-V graphs.

Most of the devices containing fullerenes adducts exhibited larger median VOC compared to that of P3HT:PCBM devices, as shown in the box plot in FIG. 6B. The difference in VOC between the derivatives of IBF-Bis and PCBM was reflected by the large differences in LUMO levels as shown in FIG. 5 and listed in Table 1. P3HT:IBF-Ep devices produced VOC that was 46 mV larger than that of a P3HT:PCBM device despite similar LUMO levels for IBF-Ep and PCBM. However, slow recombination dynamics may contribute to the large VOC of P3HT:IBF-Ep devices. Also similar fill factors (FF) were observed for all of the materials studied, suggesting similar combination of transport/recombination properties.

TABLE 2

OPV characteristics of the devices in FIG. 6A. Definitions: short-circuit current density, $J_{SC}$; open-circuit voltage, $V_{OC}$; fill factor, FF; PCE, η.

|  | IBF-Mono | IBF-Bis | IBF-Ep | IBF-Bis-Ep1 | IBF-Bis-Ep2 | PCBM |
| --- | --- | --- | --- | --- | --- | --- |
| $J_{SC}$ [mA/cm$^2$] | 1.97 | 2.45 | 11.66 | 7.10 | 7.29 | 10.51 |
| $V_{OC}$ [V] | 0.497 | 0.749 | 0.603 | 0.743 | 0.737 | 0.557 |
| FF [%] | 0.36 | 0.43 | 0.44 | 0.38 | 0.40 | 0.46 |
| η [%] | 0.36 | 0.78 | 3.10 | 2.02 | 2.12 | 2.69 |

Example 11

Optical and Electronic Characterization

In order to understand the mechanisms controlling the JSC of devices made with fullerene derivatives described herein, thin films and devices were studied using steady-state spectroscopy. The thin films were fabricated under the same conditions as used for the devices in FIG. 3A.

Figure 7:
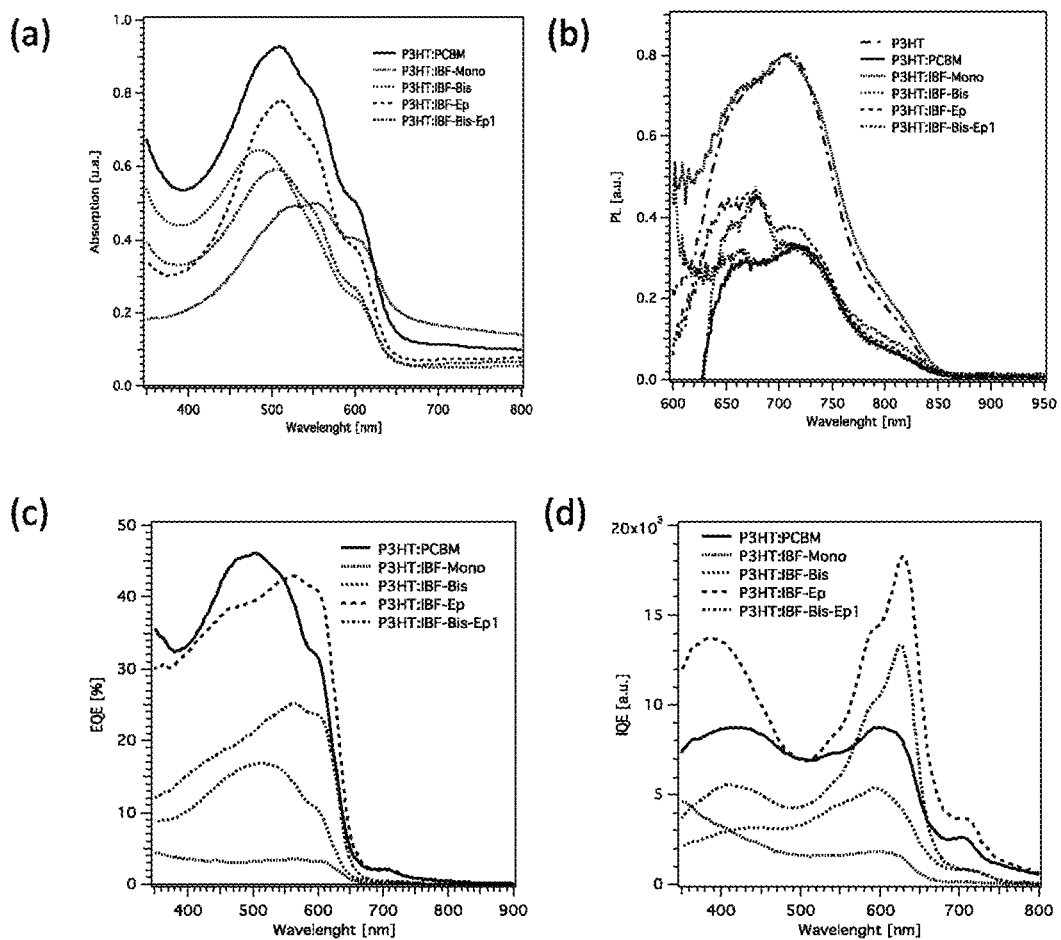
FIG. 7 shows (a) steady-state spectral UV-vis absorption spectra and (b) steady-state spectral photoluminescence emission of thin films containing various fullerene adducts; and (c) spectral external quantum efficiency (EQE) and (d) spectral internal quantum efficiency (IQE) of devices incorporating various fullerene adducts.

FIG. 7A shows steady-state spectral UV-vis absorption spectra and FIG. 7B shows steady-state spectral photoluminescence emission of thin film, for various fullerene adducts. The thin films were excited with monocromator light at 500 nm and normalized for absorption. All fullerene adducts exhibit quenched photoluminescence (PL) when blended with P3HT, except for IBF-Mono which involved high level of radiative exciton recombination. Such recombination may contribute to the low JSC observed for P3HT:IBF-Mono devices. FIG. 7C shows the Spectral External Quantum Efficiency (EQE) of the devices. P3HT:IBF-Mono devices exhibited the lowest EQE observed among the devices in this example, followed by the P3HT:IBF-Bis device. Epoxidation of the IBF-Mono and Bis resulted in devices which exhibited higher EQE, as reflected in the JSC values. FIG. 7D shows the Spectral Internal Quantum Efficiency (IQE) obtained by normalizing the EQE by the absorption. P3HT:IBF-Ep devices exhibited the highest IQE and thus the highest JSC among the devices in this example. IBF-Bis-Ep2 devices showed similar performance as the IBF-Bis-Ep1 device.

From steady-state UV-Vis absorption of thin films plotted in FIG. 7A, reduced absorption was observed for all devices with the new fullerene derivatives compared to P3HT:PCBM (at equal thicknesses). The reduced absorption of P3HT:IBF-Mono and P3HT:IBF-Bis contributed to the lower JSC observed. However, the lower absorption of P3HT:IBF-Ep devices suggested that the higher JSCs observed may be attributed to other factors, detailed below.

Figure 8:
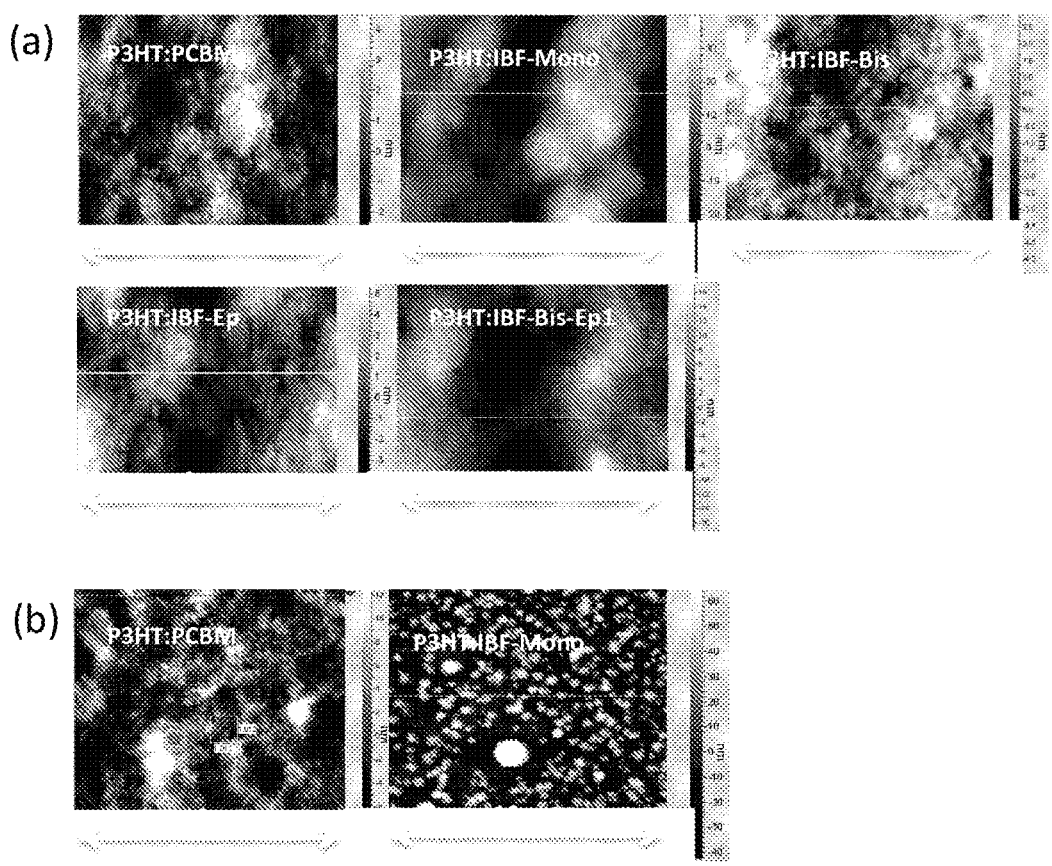
FIG. 8 shows atomic force microscopy tomography images of the devices analyzed in this study at (a) 1 micron and (b) 10 micron scale.

In addition to the reduced absorption, P3HT:IBF-Mono devices exhibited high radiative recombination, as shown in the steady-state photoluminescence (PL) emission spectra in FIG. 7B. Quenching of the PL emission of the electron donor in BHJ reflected efficient charge transfer from the donor to the acceptor. Quenched emission was observed in all BHJ blends except for P3HT:IBF-Mono, which indicated high rates of radiative exciton-recombination in P3HT:IBF-Mono films. Such high recombination may contribute to the low JSC of P3HT:IBF-Mono devices. As seen in FIG. 8, the topography images of atomic force microscopy (AFM) at 10 μm scale indicate the suboptimal phase separations of P3HT and IBF-Mono domains (as opposed to P3HT:PCBM devices), possibly induced by the low solubility of IBF-Mono.

Steady-state spectral response of the external quantum efficiency (EQE) of the devices was also studied, as shown in FIG. 7C. P3HT:IBF-Mono devices exhibited lowest EQE, as expected from the observations in UV-Vis and PL spectroscopy. Epoxidation of IBF-Mono and Bis resulted in higher EQE and JSC of devices (P3HT:IBF-Ep and P3HT:IBF-Bis-Ep1). The red-shift of the EQE maximum upon epoxidation of IBF-Bis may indicate the enhanced charge extraction from some intra-band states. Further analysis was conducted with the steady-state spectral internal quantum efficiency (IQE) which was obtained from normalizing the EQE by the absorption. As shown in FIG. 7D, P3HT:IBF-Ep exhibited the highest IQE, which resulted in the largest JSC among the devices with various fullerenes. This may be attributed at least in part to dipoles induced by the epoxide group of IBF-Ep at the donor-acceptor interface, which may play an important role in facilitating charge separation. Finally, the characteristic shape of the IQE spectra was likely due to the thickness of the devices, which may affect collection of the photocharges generated by a section of solar spectrum (~500 nm).

Example 12

Transient Measurements

Figure 9:
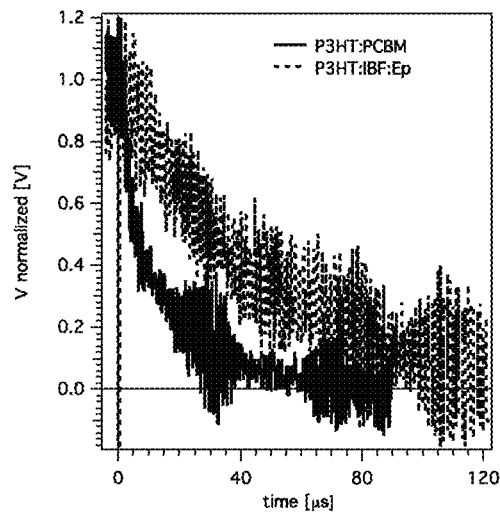
FIG. 9 shows transient photocurrents at short circuit of P3HT:PCBM and P3HT:IBF-Ep devices.

Transient Photovoltage (TPV) and photocurrent (TPC) are routinely employed to assess charge carrier recombination at an open circuit and to relate the amplitude of VOC to charge carrier recombination dynamics. Recombination lifetime at an open circuit was measured as a function of the excess charge carrier density. FIG. 9 shows transient photocurrents at short circuit of P3HT:PCBM and P3HT:IBF-Ep devices, suggesting that mobility might be higher in P3HT:PCBM devices. P3HT:PCBM devices exhibit the shortest recombination lifetime compared to other devices at the same averaged excess charge density. The slower recombination of P3HT:IBF-Ep than that of P3HT:PCBM devices could lead to larger VOC of P3HT:IBF-Ep, as the effective band gaps table 1 for two devices are similar. (FIG. 5)

Also, all IBF-$C_{60}$-based devices are characterized by similar recombination dynamics, which suggests their distinct electronic behavior at the interface with P3HT, compared to PCBM. As the recombination dynamics amongst IBF-$C_{60}$-based devices are similar, differences in VOC can be attributed at least in part to differences in LUMO energy, as shown in FIGS. 5-6 and Tables 1 and 2, except for P3HT:IBF-Mono. The low reproducibility of P3HT:IBF-Mono led to large variation of VOC values and low median VOC. In summary, the slower recombination dynamics caused by the improved electronic interface behavior between IBF-$C_{60}$ derivatives and P3HT could induce the generation of large VOC for the corresponding devices.

Figure 10:
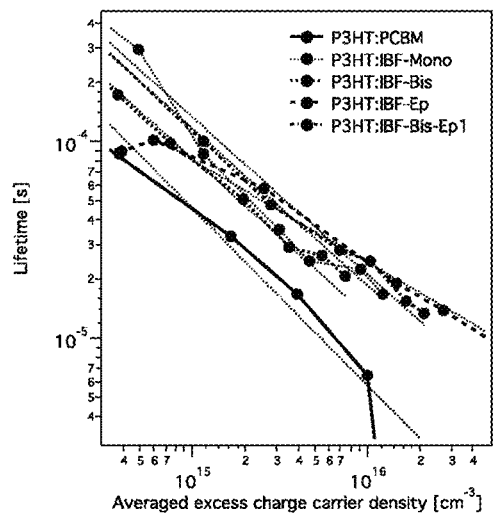
FIG. 10 shows recombination lifetime as a function of the averaged excess charge density measured with transient photovoltage and photocurrent (TPV/TPC).

FIG. 10 shows recombination lifetime as a function of the averaged excess charge density measured with transient photovoltage and photocurrent (TPV/TPC). P3HT:PCBM devices exhibit the fastest recombination lifetime compared at the same averaged excess charge density. The slower recombination of P3HT:IBF-Ep devices leads to the larger $V_{OC}$ relative to P3HT:PCBM devices. Also, IBF-$C_{60}$-based devices are characterized by similar recombination rates, suggesting their similar electronic behavior at the interface with P3HT. The different $V_{OC}$ values observed may be influenced by the differences in LUMO energy level.

Example 13

Solar cells were fabricated having the following structure (an "inverted" structure): Glass/ITO/ZnO/polymer:IBF-Ep/Al/MoO$_3$/Ag. Prior to use, the patterned ITO-coated glass substrates were cleaned with detergent and water, then ultrasonicated in acetone and isopropyl alcohol for 15 min each. The ZnO layer was deposited by spin-coating according to the method described in Po et al., "From lab to fab: how must the polymer solar cell materials design change?—an industrial perspective," Energy Environ. Sci. 2014, 7, 925-943, the contents of which are incorporated herein by reference in its entirety for all purposes. Poly{[4'-(4,8-di(2-ethylhexyloxy)benzo[1,2-b:4,5-b']dithiophen-2-yl)-2',1',3'-benzothiadiazole-6,7'-diyl]-co-[4'-(4,8-di(2-ethylhexyloxy)benzo[1,2-b:4,5-b']dithiophen-2-yl)-(1-octylnonyl)-benzotriazole-6,7'-diyl]} and IBF-Ep (1:2 w/w), were dissolved in chlorobenzene (18 mg/ml total concentration) and stirred at 70° C. overnight. The solution was then filtered through a 5 micron Teflon-filter, then spincoated onto the ZnO layer at 1000 rpm under nitrogen and annealed on a 150° C. hotplate for 20 min under nitrogen.

A 10 nm MoO$_3$ buffer layer and a 100 nm aluminum layer were deposited by vacuum deposition. The photovoltaic parameters were measured using a shadow mask of 16 mm$^2$. The device electrical characterization was carried out at room temperature in glove-box. Solar cells were illuminated using a solar simulator (Sun 2000, Abet Technologies) and the light power intensity was calibrated at AM1.5 illumination conditions (100 mW cm$^{-2}$) using a certified KG-5 filtered silicon solar cell. The current-voltage curves were taken with a Keithley 2602 source-measure.

Comparative Example 1

The same procedure was used to test the blend Poly{[4'-(4,8-di(2-ethylhexyloxy)benzo[1,2-b:4,5-b']dithiophen-2-yl)-2',1',3'-benzothiadiazole-6,7'-diyl]-co-[4'-(4,8-di(2-ethylhexyloxy)benzo[1,2-b:4,5-b']dithiophen-2-yl)-(1-octylnonyl)-benzotriazole-6,7'-diyl]}:PCBM.

Comparative Example 2

The same procedure was used to test the blend Poly{[4'-(4,8-di(2-ethylhexyloxy)benzo[1,2-b:4,5-b']dithiophen-2-yl)-2',1',3'-benzothiadiazole-6,7'-diyl]-co-[4'-(4,8-di(2-ethylhexyloxy)benzo[1,2-b:4,5-b']dithiophen-2-yl)-(1-octylnonyl)-benzotriazole-6,7'-diyl]}:ICBA.

Table 3 shows a summary of the photovoltaic parameters for the devices in this example.

TABLE 3

Summary of the photovoltaic parameters

| Sample | $V_{oc\ best}$ (mV) | $J_{sc\ best}$ (mA cm$^{-2}$) | $FF_{best}$ | $PCE_{best}$ (%) |
| --- | --- | --- | --- | --- |
| Example 1 | 0.81 | 6.84 | 0.58 | 3.24 |
| Comparative 1 | 0.80 | 5.35 | 0.63 | 2.66 |
| Comparative 2 | 0.79 | 2.61 | 0.47 | 0.98 |

What is claimed is:

1. A device, comprising:
   a composition comprising a carbon nanostructure comprising a substituted isobenzofulvene group or a substituted indane group; and
   at least one electrode in electrochemical communication with the composition,
   wherein the carbon nanostructure comprises the following structure,

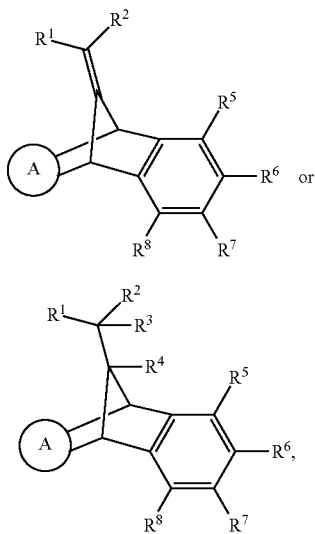

wherein:
A comprises the fused network of aromatic rings of the carbon nanostructure; and
$R^1$-$R^8$ can be the same or different and are hydrogen, hydroxyl, halo, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

2. A device as in claim 1, wherein the carbon nanostructure comprises a fused network of aromatic rings, optionally comprising a border at which the fused network terminates, wherein the substituted isobenzofulvene group or substituted indane group is attached to the network via at least one ring atom of the network.

3. A device as in claim 2, wherein a ring atom of the substituted isobenzofulvene group or substituted indane group forms a covalent bond with a ring atom of the network of aromatic rings.

4. A device as in claim 2, wherein two ring atoms of the substituted isobenzofulvene group or substituted indane group form covalent bonds with two ring atoms of the network of aromatic rings.

5. A device as in claim 1, wherein the carbon nanostructure comprises two substituted isobenzofulvene groups or two substituted indane groups.

6. A device as in claim 1, wherein the carbon nanostructure comprises an indane group substituted with an epoxide ring.

7. A device as in claim 1, wherein the carbon nanostructure is a fullerene, a nanotube, graphene, or graphite.

8. A device as in claim 1, wherein the carbon nanostructure is a single-walled or multi-walled nanotube.

9. A device as in claim 1, wherein the carbon nanostructure is a fullerene.

10. A device as in claim 1, wherein the substituted isobenzofulvene group or substituted indane group is substituted with an electron-donating group.

11. A device as in claim 1, wherein the substituted isobenzofulvene group or substituted indane group is substituted with an electron-withdrawing group.

12. A device as in claim 1, wherein $R^1$-$R^8$ are the same or different and are hydrogen, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

13. A device as in claim 1, wherein $R^1$ and $R^2$ are each independently alkyl.

14. A device as in claim 1, wherein $R^5$-$R^8$ are each hydrogen.

15. A device as in claim 1, wherein the carbon nanostructure has a structure as in Formula (I), wherein $R^1$ and $R^2$ are each methyl and $R^5$-$R^8$ are each hydrogen.

16. A device as in claim 1, wherein the carbon nanostructure has a structure as in Formula (II), wherein $R^1$, $R^2$, and $R^5$-$R^8$ can be the same or different and are hydrogen, hydroxyl, halo, alkyl, heteroalkyl, alkenyl, heteroalkenyl, aryl, heteroaryl, or heterocycle, any of which is optionally substituted, and $R^3$ and $R^4$ are joined together to form an epoxide ring.

17. A device as in claim 1, wherein the carbon nanostructure has a structure as in Formula (II), wherein $R^1$ and $R^2$ are each methyl, $R^3$ and $R^4$ are joined together to form an epoxide ring, and $R^5$-$R^8$ are each hydrogen.

18. A device as in claim 1, further comprising a polymer in contact with the composition.

19. A device as in claim 1, wherein the device is a battery, capacitor, transistor, catalyst system, solar cell, or chemical or biological sensor.

20. A composition, comprising:
a carbon nanostructure comprising a fused network of aromatic rings, optionally comprising a border at which the fused network terminates, wherein the carbon nanostructure comprises the following structure,

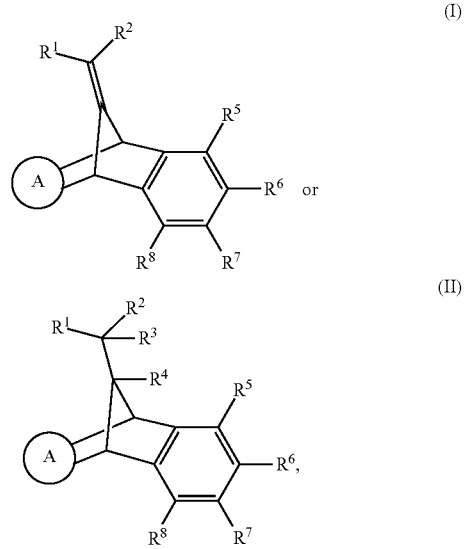

wherein:
A comprises the fused network of aromatic rings of the carbon nanostructure; and
$R^1$-$R^8$ can be the same or different and are hydrogen, hydroxyl, halo, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

21. A composition as in claim 20, wherein $R^1$-$R^8$ are the same or different and are hydrogen, alkyl, heteroalkyl, alkenyl, heteroalkenyl, aryl, heteroaryl, or heterocycle, any of which is optionally substituted, provided that at least one of $R^1$-$R^8$ is not hydrogen; or, $R^3$ and $R^4$ are joined together to form an optionally substituted ring.

22. A device, comprising:
   a composition comprising a carbon nanostructure comprising a substituted indane group; and
   at least one electrode in electrochemical communication with the composition, wherein the carbon nanostructure comprises an indane group substituted with an epoxide ring.

\* \* \* \* \*